(12) United States Patent
Ariyoshi

(10) Patent No.: US 9,437,596 B2
(45) Date of Patent: Sep. 6, 2016

(54) SEMICONDUCTOR DEVICE AND METHOD FOR MANUFACTURING SEMICONDUCTOR DEVICE

(71) Applicant: FUJITSU SEMICONDUCTOR LIMITED, Yokohama-shi, Kanagawa (JP)

(72) Inventor: Junichi Ariyoshi, Mie (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/206,345

(22) Filed: Mar. 12, 2014

(65) Prior Publication Data

US 2014/0291807 A1  Oct. 2, 2014

(30) Foreign Application Priority Data

Mar. 28, 2013 (JP) .................... 2013-068949

(51) Int. Cl.
*H01L 27/092* (2006.01)
*H01L 21/8238* (2006.01)
*H01L 21/265* (2006.01)

(52) U.S. Cl.
CPC ... *H01L 27/0928* (2013.01); *H01L 21/823892* (2013.01); *H01L 21/26586* (2013.01)

(58) Field of Classification Search
USPC .................................... 257/E21.63
See application file for complete search history.

(56) References Cited

U.S. PATENT DOCUMENTS

| | | | |
|---|---|---|---|
| 6,097,078 A | 8/2000 | Sim et al. | |
| 2007/0141794 A1* | 6/2007 | Morris | 438/294 |
| 2008/0203424 A1* | 8/2008 | Chen et al. | 257/102 |
| 2013/0105904 A1* | 5/2013 | Roybal et al. | 257/369 |

FOREIGN PATENT DOCUMENTS

JP  11-297853 A  10/1999

* cited by examiner

*Primary Examiner* — Daniel Luke
(74) *Attorney, Agent, or Firm* — Westerman, Hattori, Daniels & Adrian, LLP

(57) ABSTRACT

A semiconductor device includes a substrate, a first well of a first conductivity type formed within the substrate, a second well of a second conductivity type formed underneath the first well within the substrate and a third well of the second conductivity type formed horizontally to the first well within the substrate, and including a first region formed to a first depth from a surface of the substrate, and a second region formed to a second depth greater than the first depth from the surface of the substrate and connected to the second well.

19 Claims, 30 Drawing Sheets

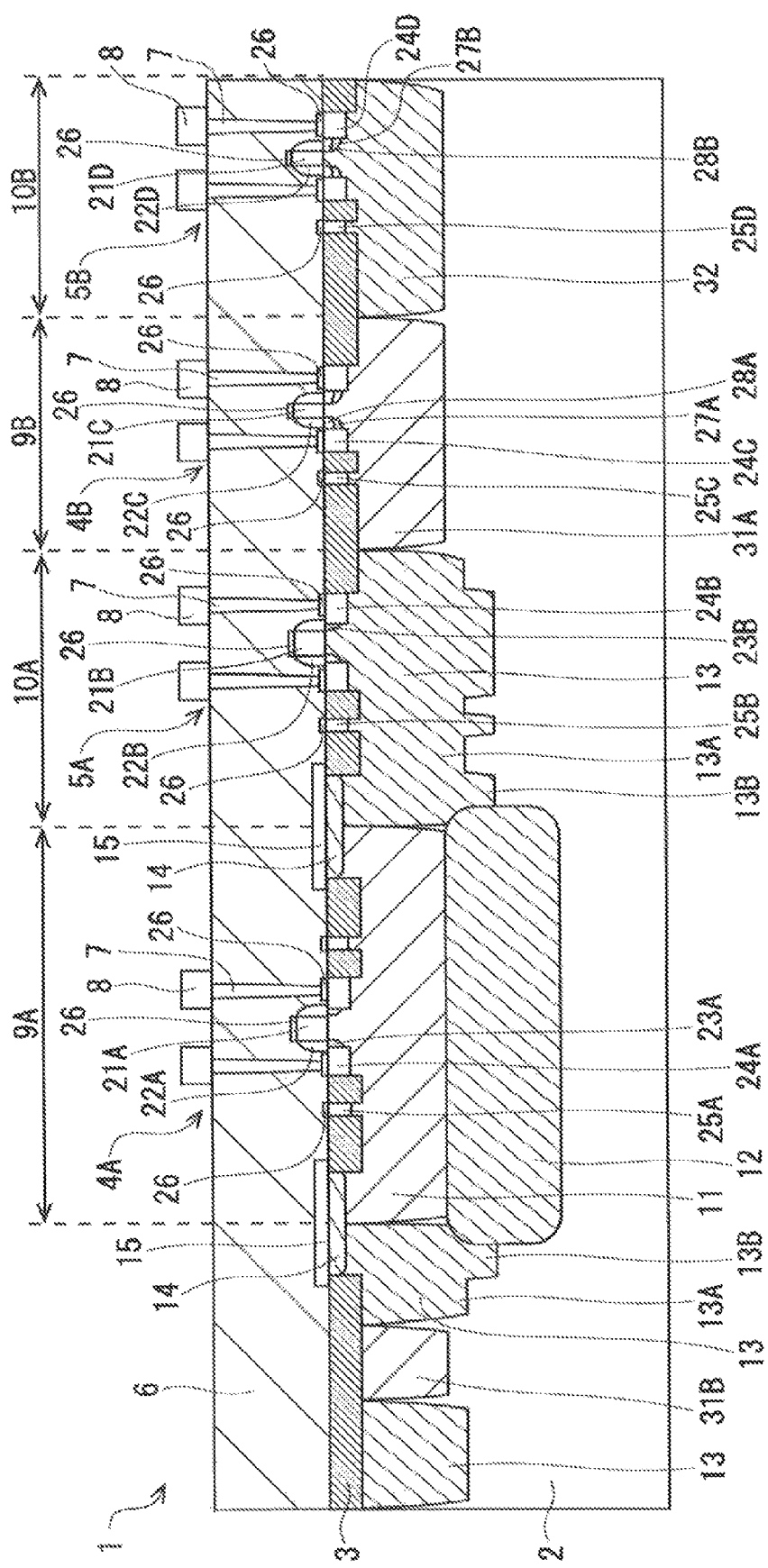

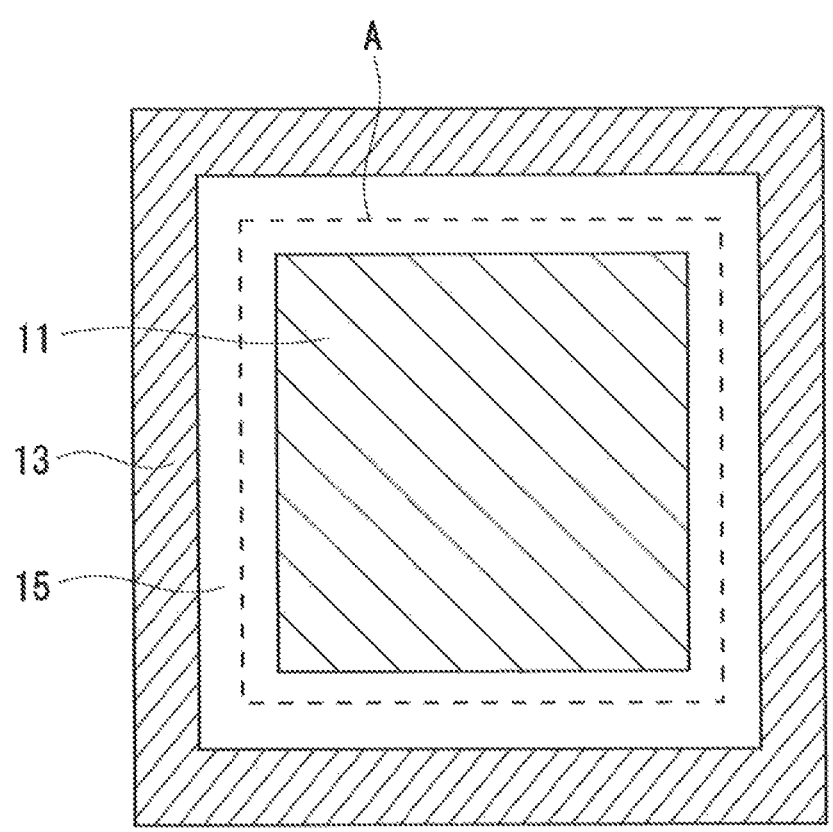

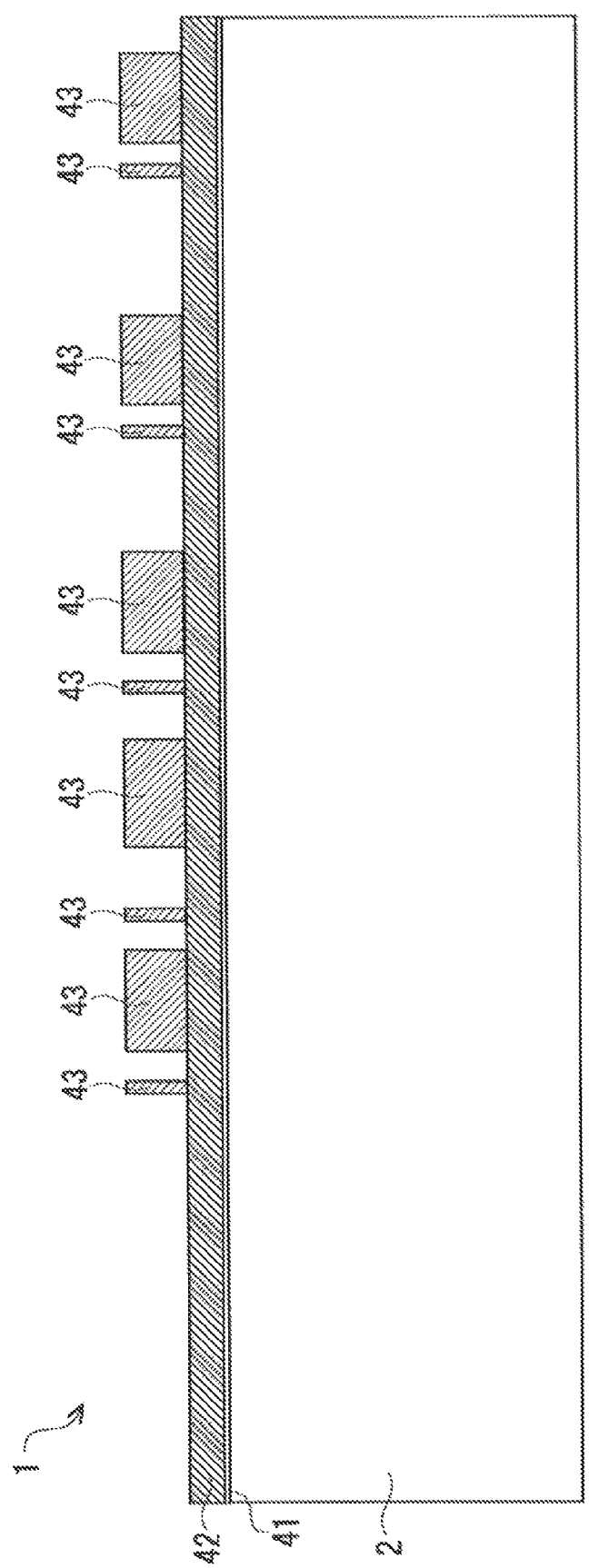

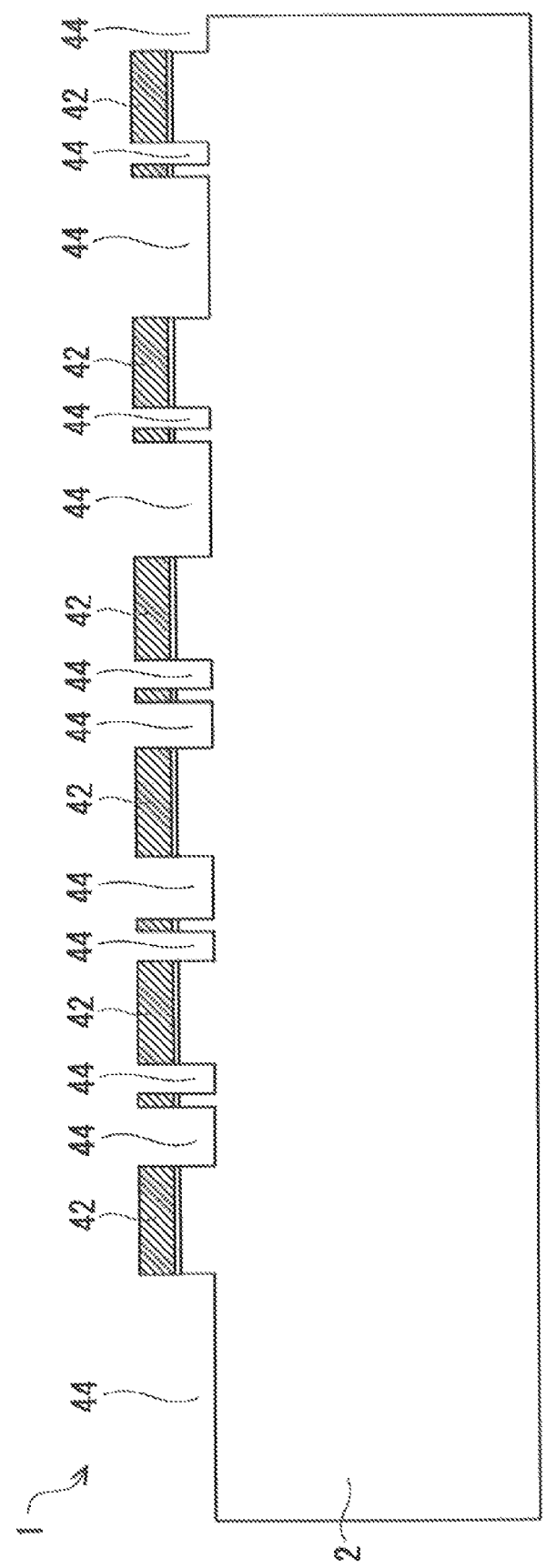

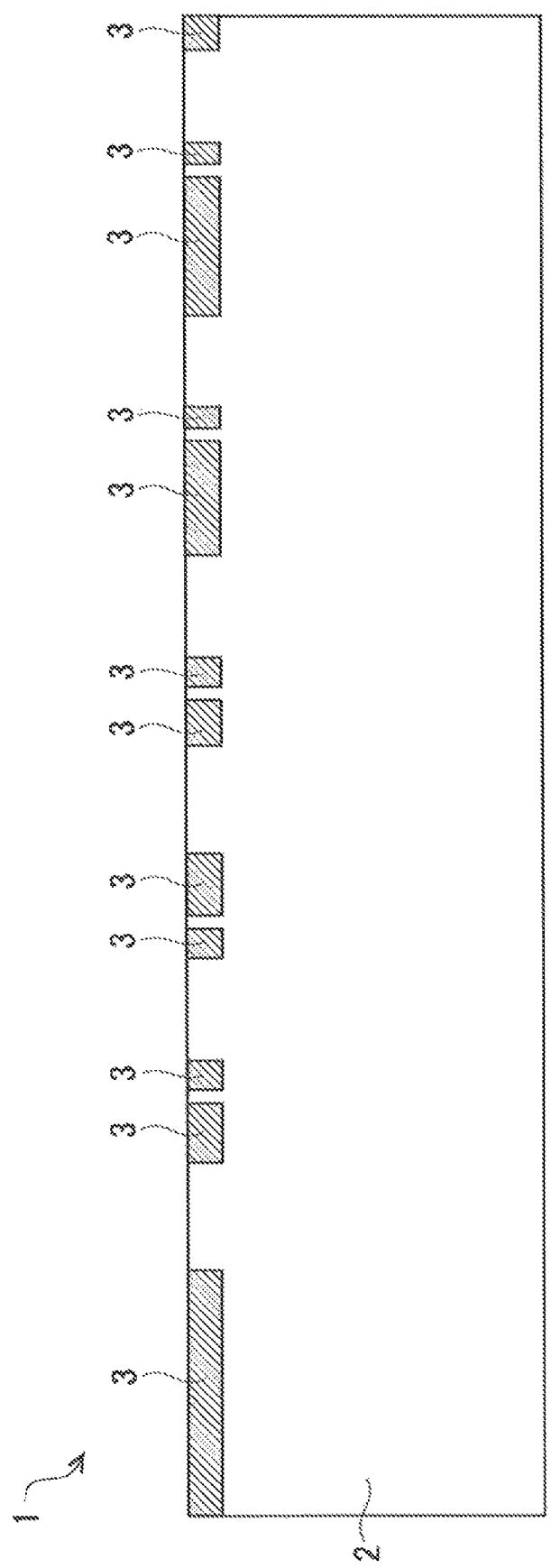

FIG. 22

| | | HVPW105 | DNW106 | HVNW107 | |
|---|---|---|---|---|---|
| VERIFICATION CONDITIONS A | ACCELERATION ENERGY | 420keV | 2000keV | 480keV | |
| | AMOUNT OF IMPLANTATION | $1.40 \times 10^{13}/cm^2$ | $2.00 \times 10^{13}/cm^2$ | $1.16 \times 10^{13}/cm^2$ | |
| | TILT ANGLE | — | — | 7° | |
| VERIFICATION CONDITIONS B | ACCELERATION ENERGY | 420keV | 2000keV | 480keV | |
| | AMOUNT OF IMPLANTATION | $1.40 \times 10^{13}/cm^2$ | $2.00 \times 10^{13}/cm^2$ | $1.16 \times 10^{13}/cm^2$ | |
| | TILT ANGLE | — | — | 0° | |
| | | HVPW11 | DNW12 | HVNW13 | IMPURITY LAYER 14 |
| VERIFICATION CONDITIONS C | ACCELERATION ENERGY | 420keV | 2000keV | 480keV | 40keV |
| | AMOUNT OF IMPLANTATION | $1.40 \times 10^{13}/cm^2$ | $2.00 \times 10^{13}/cm^2$ | $1.16 \times 10^{13}/cm^2$ | $3.20 \times 10^{13}/cm^2$ |
| | TILT ANGLE | — | — | 7° | — |
| VERIFICATION CONDITIONS D | ACCELERATION ENERGY | 420keV | 2000keV | 480keV | 40keV |
| | AMOUNT OF IMPLANTATION | $1.40 \times 10^{13}/cm^2$ | $2.00 \times 10^{13}/cm^2$ | $1.16 \times 10^{13}/cm^2$ | $3.20 \times 10^{13}/cm^2$ |
| | TILT ANGLE | — | — | 0° | — |

VERIFICATION RESULT A

VERIFICATION RESULT B

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority of the prior Japanese Patent Application No. 2013-068949, filed on Mar. 28, 2013, the entire contents of which are incorporated herein by reference.

FIELD

Embodiment relates to a semiconductor device and a method for manufacturing the semiconductor device.

BACKGROUND

In a P-type MOS (Metal Oxide Semiconductor) transistor which is one example of a semiconductor element, a P-type well is formed in an upper portion of a P-type silicon (Si) substrate, and source/drain regions, a gate insulating film and a gate electrode are formed within the P-type well. In addition, there is known a triple well structure in which the periphery of a P-type well where an N-type MOS transistor is formed is surrounded with N-type wells in a P-type silicon substrate.

[Patent document 1] Japanese Laid-open Patent Publication No. 11-297853

SUMMARY

If the resistance of a portion of the triple well structure between an N-type well underneath the P-type well and an N-type well located in the horizontal direction thereof is high, there arises such a problem that latch-up occurs in an I/O section.

A semiconductor device according to one aspect of the embodiment includes a substrate, a first well of a first conductivity type formed within the substrate, a second well of a second conductivity type formed underneath the first well within the substrate and a third well of the second conductivity type formed horizontally to the first well within the substrate, and including a first region formed to a first depth from a surface of the substrate, and a second region formed to a second depth greater than the first depth from the surface of the substrate and connected to the second well.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 1A is a cross-sectional view of a semiconductor device;
FIG. 1B is a plan view of the semiconductor device;
FIG. 2 is a cross-sectional view (first of 17 views) illustrating a step of a method for manufacturing a semiconductor device according to an embodiment;
FIG. 3 is a cross-sectional view (second of 17 views) illustrating a step of the method for manufacturing a semiconductor device according to the embodiment;
FIG. 4 is a cross-sectional view (third of 17 views) illustrating a step of the method for manufacturing a semiconductor device according to the embodiment;
FIG. 22 is a drawing indicating verification conditions.

DESCRIPTION OF EMBODIMENT

Figure 27:
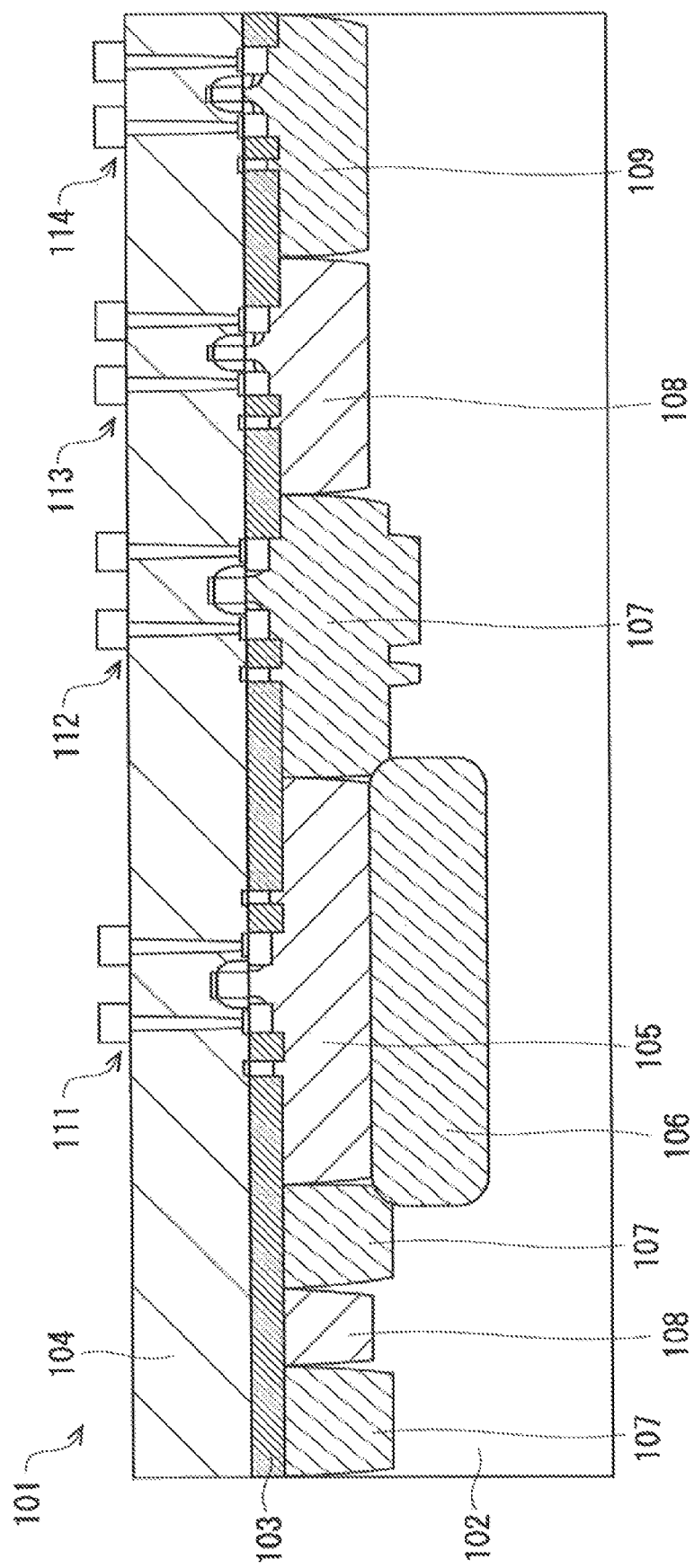
FIG. 27 is a cross-sectional view of a semiconductor device having a triple well structure.

A description will be made of the problems that the inventors of the present application have found as the result of examination. FIG. 27 is a cross-sectional view of a semiconductor device 101 having a triple well structure. As illustrated in FIG. 27, an element-isolating insulating film 103 and an interlayer insulating film 104 are formed on a semiconductor substrate (P-type silicon substrate) 102. In addition, as illustrated in FIG. 27, a HVPW (High Voltage P Well) 105 is formed within the semiconductor substrate 102, and a DNW (Deep N Well) 106 and a HVNW (High Voltage N Well) 107 are formed so as to surround the HVPW 105. An N-type MOS transistor 111 to be driven at a high voltage is formed in the HVPW 105, and a P-type MOS transistor 112 to be driven at a high voltage is formed in the HVNW 107. Yet additionally, as illustrated in FIG. 27, a LVPW (Low Voltage P Well) 108 and a LVNW (Low Voltage N Well) 109 are formed within the semiconductor substrate 102. An N-type MOS transistor 113 to be driven at a low voltage is formed in the LVPW 108, and a P-type MOS transistor 114 to be driven at a low voltage is formed in the LVNW 109.

If the area of the connecting part between the DNW 106 and the HVNW 107 is small, the resistance between the DNW 106 and the HVNW 107 is high, thus causing latch-up in an I/O section. The characteristics of the P-type MOS transistor 112 formed in the HVNW 107 may vary if the area of the connecting part between the DNW 106 and the HVNW 107 is increased by deeply forming the HVNW 107 in whole. In a case where the LVPW 108 is formed between the HVNW 107 and the HVNW 107, the withstand voltage of the LVPW 108 is lowered by deeply forming the HVNW 107 in whole. If an attempt is made to deeply form the LVPW 108 in order to raise the withstand voltage thereof, the LVPW 108 widens in whole, thus causing the semiconductor device 101 as a whole to increase in size.

Hereinafter, a semiconductor device according to the embodiment and a method for manufacturing the semiconductor device to the embodiment will be described with reference to the accompanying drawings. The semiconductor device and the method for manufacturing the semiconductor device to be described hereinbelow are merely examples. The semiconductor device according to the embodiment and the method for manufacturing the semiconductor device to the embodiment are therefore not limited to those described below.

In the embodiment, a description will be made by taking, for example, a semiconductor device 1 provided with an N-type MOS transistor and a P-type MOS transistor each of which is one example of semiconductor elements. FIG. 1A is a cross-sectional view of the semiconductor device 1. The semiconductor device 1 includes a semiconductor substrate 2, an element-isolating insulating film 3, N-type MOS transistors 4A and 4B, P-type MOS transistors 5A and 5B, an interlayer insulating film 6, contact plugs 7, and wiring lines 8. The semiconductor substrate 2 is, for example, a P-type monocrystalline silicon (Si) substrate the front surface of which is a (001) face.

The N-type MOS transistor 4A is an N-type MOS transistor to be driven at a high voltage. A HVPW (High Voltage P Well) 11 is formed in a region (N-type MOS forming region) 9A within the semiconductor substrate 2 in which the N-type MOS transistor 4A is formed. The HVPW 11 is one example of a first well of a first conductivity type.

A DNW (Deep N Well) 12 is formed underneath the HVPW 11 within the semiconductor substrate 2. The DNW 12 is one example of a second well of a second conductivity type. A HVNW (High Voltage N Well) 13 is formed horizontally to the HVPW 11 within the semiconductor substrate 2. The HVNW 13 is one example of a third well of the second conductivity type. As described above, the semiconductor device 1 has a triple well structure in which the HVPW 11 is surrounded with the DNW 12 and the HVNW 13.

The HVNW 13 includes a shallow region 13A formed to a predetermined depth (first depth) from the front surface of the semiconductor substrate 2, and a deep region 13B formed deeper than the predetermined depth (first depth) from the front surface of the semiconductor substrate 2. The shallow region 13A is one example of the first region. The deep region 13B is one example of the second region. The shallow region 13A of the HVNW 13 is formed downward from the front surface of the semiconductor substrate 2 up to a first position within the semiconductor substrate 2. The deep region 13B of the HVNW 13 is formed downward from the front surface of the semiconductor substrate 2 up to a second position within the semiconductor substrate 2. The second position within the semiconductor substrate 2 is deeper than the first position within the semiconductor substrate 2.

The deep region 13B of the HVNW 13 is formed up to a position within the semiconductor substrate 2 deeper than the shallow region 13A of the HVNW 13. The deep region 13B of the HVNW 13 is connected to the DNW 12, thus increasing the area of the connecting part (contacting part) between the DNW 12 and the HVNW 13. An increase in the area of the connecting part between the DNW 12 and the HVNW 13 causes the resistance between the DNW 12 and the HVNW 13 to become lower.

The element-isolating insulating film 3 is formed on the shallow region 13A of the HVNW 13, whereas the element-isolating insulating film 3 is not formed on the deep region 13B of the HVNW 13. That is, the semiconductor device 1 includes the element-isolating insulating film 3 formed on the shallow region 13A of the HVNW 13 in the semiconductor substrate 2. In addition, the upper surface of the semiconductor substrate 2 continuous to the upper surface of the element-isolating insulating film 3 is positioned on the deep region 13B of the HVNW 13. The element-isolating insulating film 3 is also referred to as an STI (Shallow Trench Isolation) film. An impurity layer 14 is formed on the upper portion of the connecting part (boundary) between the HVPW 11 and the HVNW 13. A silicide block layer 15 is formed on the impurity layer 14.

As illustrated in FIG. 1B, the HVNW 13 is formed within semiconductor substrate 2, so as to surround the HVPW 11 in the horizontal direction thereof. FIG. 1B is a plan view of the semiconductor device 1. In FIG. 1B, some constituent elements of the semiconductor device 1 are omitted from the illustration. A dotted line A in FIG. 1B indicates the connecting part between the HVPW 11 and the HVNW 13. The silicide block layer 15 is formed so as to cover the impurity layer 14 formed on the upper portion of the connecting part between the HVPW 11 and the HVNW 13. Since the impurity layer 14 is covered with the silicide block layer 15, the impurity layer 14 is hidden by the silicide block layer 15 in FIG. 1B. The impurity layer 14 has an annular shape (ring shape), in plan view, extended along the connecting part between the HVPW 11 and the HVNW 13. Accordingly, the silicide block layer 15 has an annular shape (ring shape), in plan view, extended along the connecting part between the HVPW 11 and the HVNW 13.

Referring back to FIG. 1A, the N-type MOS transistor 4A includes a gate electrode 21A, a sidewall insulating film 22A, a gate insulating film (not illustrated), an LDD (Lightly Doped Drain) region 23A, a source/drain region 24A, and a tap region 25A. Metal silicide layers 26 are formed on the gate electrode 21A, the source/drain region 24A and the tap region 25A.

The P-type MOS transistor 5A is a P-type MOS transistor to be driven at a high voltage. The HVNW 13 is formed in a region (P-type MOS forming region) 10A within the semiconductor substrate 2 where the P-type MOS transistor 5A is formed. The P-type MOS transistor 5A includes a gate electrode 21B, a sidewall insulating film 22B, a gate insulating film (not illustrated), an LDD (Lightly Doped Drain) region 23B, a source/drain region 24B, and a tap region 25B. Metal silicide layers 26 are formed on the gate electrode 21B, the source/drain region 24B and the tap region 25B. The tap region 25B is formed in a portion of the HVNW 13 illustrated at the leftmost end of FIG. 1A. The tap region 25B is omitted from the illustration, however, in FIG. 1A.

The N-type MOS transistor 4B is an N-type MOS transistor to be driven at a low voltage. A LVPW (Low Voltage P Well) 31A is formed in a region (N-type MOS forming region) 9B within the semiconductor substrate 2 where the N-type MOS transistor 4B is formed. The N-type MOS transistor 4B includes a gate electrode 21C, a sidewall insulating film 22C, a gate insulating film (not illustrated), a source/drain region 24C, a tap region 25C, a pocket region 27A, and an extension region 28A. Metal silicide layers 26 are formed on the gate electrode 21C, the source/drain region 24C and the tap region 25C.

The P-type MOS transistor 5B is a transistor to be driven at a low voltage. A LVNW (Low Voltage N Well) 32 is formed in a region (P-type MOS forming region) 10B within the semiconductor substrate 2 where the P-type MOS transistor 5B is formed. The P-type MOS transistor 5B includes a gate electrode 21D, a sidewall insulating film 22D, a gate insulating film (not illustrated), a source/drain region 24D, a tap region 25D, a pocket region 27B, and an extension region 28B. Metal silicide layers 26 are formed on the gate electrode 21D, the source/drain region 24D and the tap region 25D.

The LVPW 31B may be formed between the HVNW 13 and the HVNW 13. The LVPW 31B is one example of a forth well of the first conductivity type. Since the LVPW 31B is formed within the semiconductor substrate 2 adjacently to the shallow region 13A of the HVNW 13, the withstand voltage of the LVPW 31B is prevented from becoming lower. The tap region 25C is formed in the LVPW 31B, but is omitted from the illustration in FIG. 1A.

<Manufacturing Method>

A description will be made of a method for manufacturing the semiconductor device 1 according to the embodiment. FIGS. 2 to 18 are cross-sectional views illustrating respective steps of the method for manufacturing the semiconductor device 1 according to the embodiment. In the method for manufacturing the semiconductor device 1 according to the embodiment, a silicon oxide film (SiO film) 41 is first formed on the semiconductor substrate 2 in a step illustrated in FIG. 2. Then, a silicon nitride film (SiN film) 42 is formed on the oxide film 41. The silicon oxide film 41 is formed by, for example, a thermal oxidation method, and the silicon nitride film 42 is deposited thereon by, for example, a CVD (Chemical Vapor Deposition) method. In the step illustrated in FIG. 2, a photoresist film 43 whose place where the element-isolating insulating film 3 is to be formed is opened is formed on the silicon nitride film 42 by photolithography.

Next, in a step illustrated in FIG. 3, dry etching is performed using the photoresist film 43 as a mask to form trenches 44 in the semiconductor substrate 2. Thereafter, remaining portions of the photoresist film 43 are removed by, for example, asking.

Subsequently, in a step illustrated in FIG. 4, a silicon oxide film is formed within the trenches 44 by a CVD method, and the film is planarized by CMP (Chemical Mechanical Polishing) to form the element-isolating insulating film 3 on the semiconductor substrate 2. FIG. 4 illustrates an example of forming the element-isolating insulating film 3 on the semiconductor substrate 2 by an STI method. Alternatively, however, the element-isolating insulating film 3 may be formed on the semiconductor substrate 2 by, for example, a LOCOS (Local Oxidation of Silicon) method.

Figure 5:
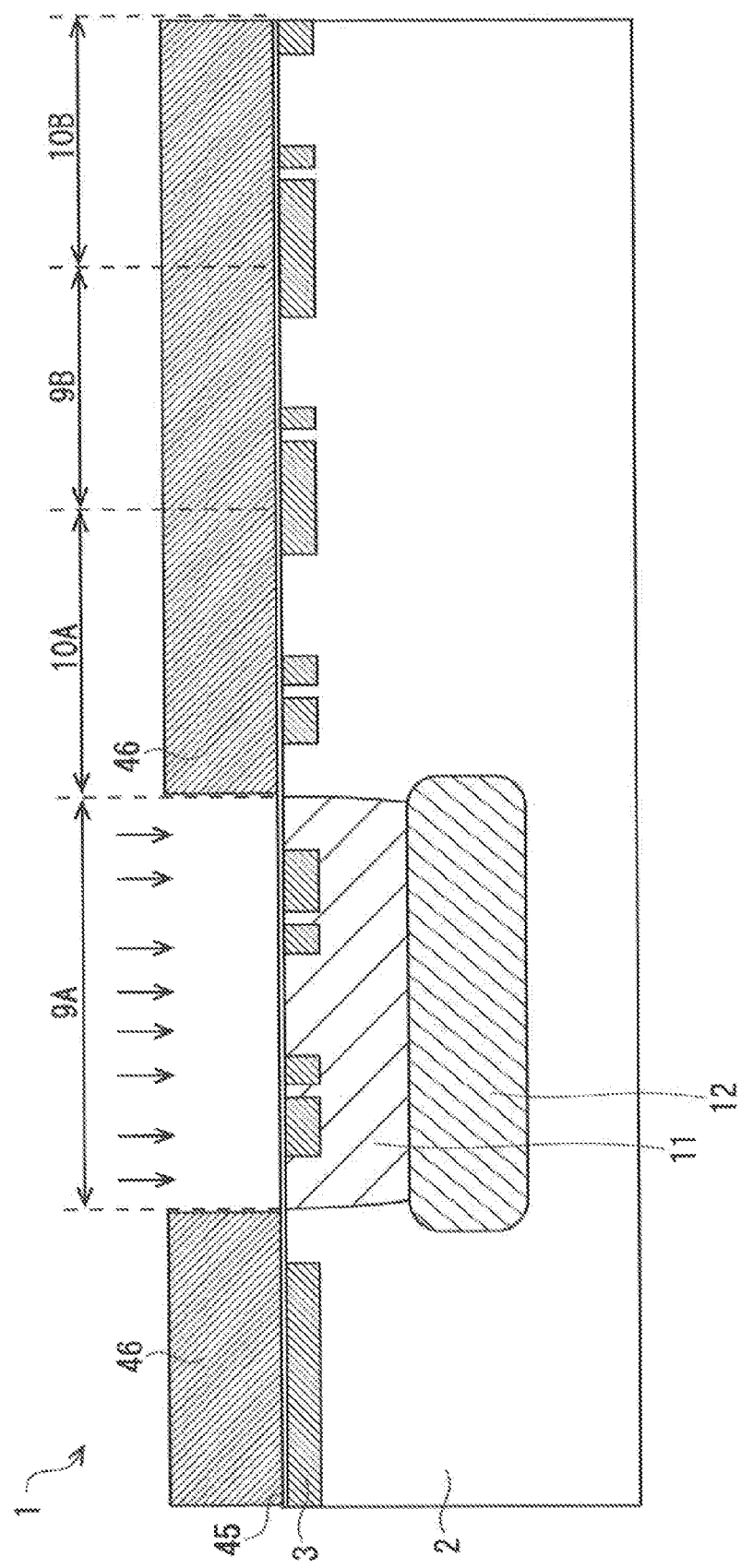
FIG. 5 is a cross-sectional view (fourth of 17 views) illustrating a step of the method for manufacturing a semiconductor device according to the embodiment.

Next, in a step illustrated in FIG. 5, a silicon oxide film 45 is formed on the semiconductor substrate 2 by, for example, a thermal oxidation method. The silicon oxide film 45 functions as a sacrificial oxide film. In the step illustrated in FIG. 5, a photoresist film 46 is formed on the semiconductor substrate 2 by photolithography. In the step illustrated in FIG. 5, P-type impurities are ion-implanted using the photoresist film 46 as a mask to form a HVPW 11 within the semiconductor substrate 2. In the step illustrated in FIG. 5, N-type impurities are ion-implanted using the photoresist film 46 as a mask to form a DNW 12 within the semiconductor substrate 2. Using the same mask (photoresist film 46), the HVPW 11 and the DNW 12 are formed in an N-type MOS forming region 9A within the semiconductor substrate 2.

The HVPW 11 is formed in a region ranging from the front surface of the semiconductor substrate 2 to a predetermined depth. The HVPW 11 is formed by ion-implanting, for example, boron (B) under the condition of an acceleration energy of 150 keV or higher but not higher than 600 keV and an amount of implantation (dose amount) of $1.0 \times 10^{12}/cm^2$ or larger but not larger than $1.0 \times 10^{14}/cm^2$. The DNW 12 is formed underneath the HVPW 11. The DNW 12 is formed by ion-implanting, for example, phosphorus (P) under the condition of an acceleration energy of 700 keV or higher but not higher than 4.0 MeV and an amount of implantation of $1.0 \times 10^{12}/cm^2$ or larger but not larger than $1.0 \times 10^{14}/cm^2$. Thereafter, the photoresist film 46 is removed by, for example, asking.

Subsequently, in a step illustrated in FIG. 6, a photoresist film 47 is formed on the semiconductor substrate 2 by photolithography. In the step illustrated in FIG. 6, N-type impurities are ion-implanted using the photoresist film 47 as a mask to form a HVNW 13 within the semiconductor substrate 2. For example, the HVNW 13 is formed within the semiconductor substrate 2, so as to surround the HVPW 11 in the horizontal direction thereof. The HVNW 13 is formed by ion-implanting, for example, phosphorus (P) under the condition of an acceleration energy of 360 keV or higher but not higher than 700 keV, an amount of implantation of $1.0 \times 10^{12}/cm^2$ or larger but not larger than $1.0 \times 10^{14}/cm^2$, and a tilt angle of 0°.

Figure 6:
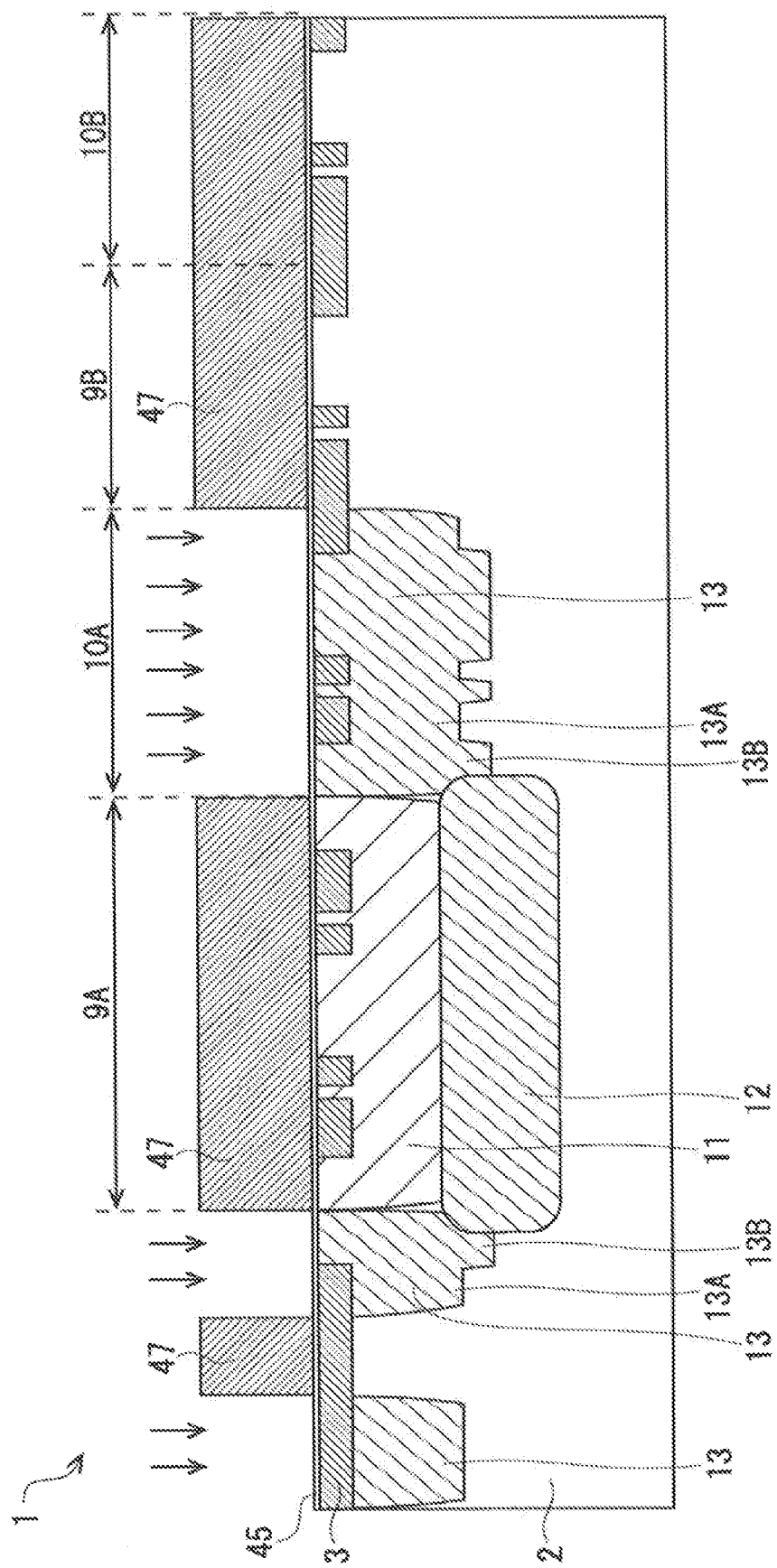
FIG. 6 is a cross-sectional view (fifth of 17 views) illustrating a step of the method for manufacturing a semiconductor device according to the embodiment.
Figure 7:
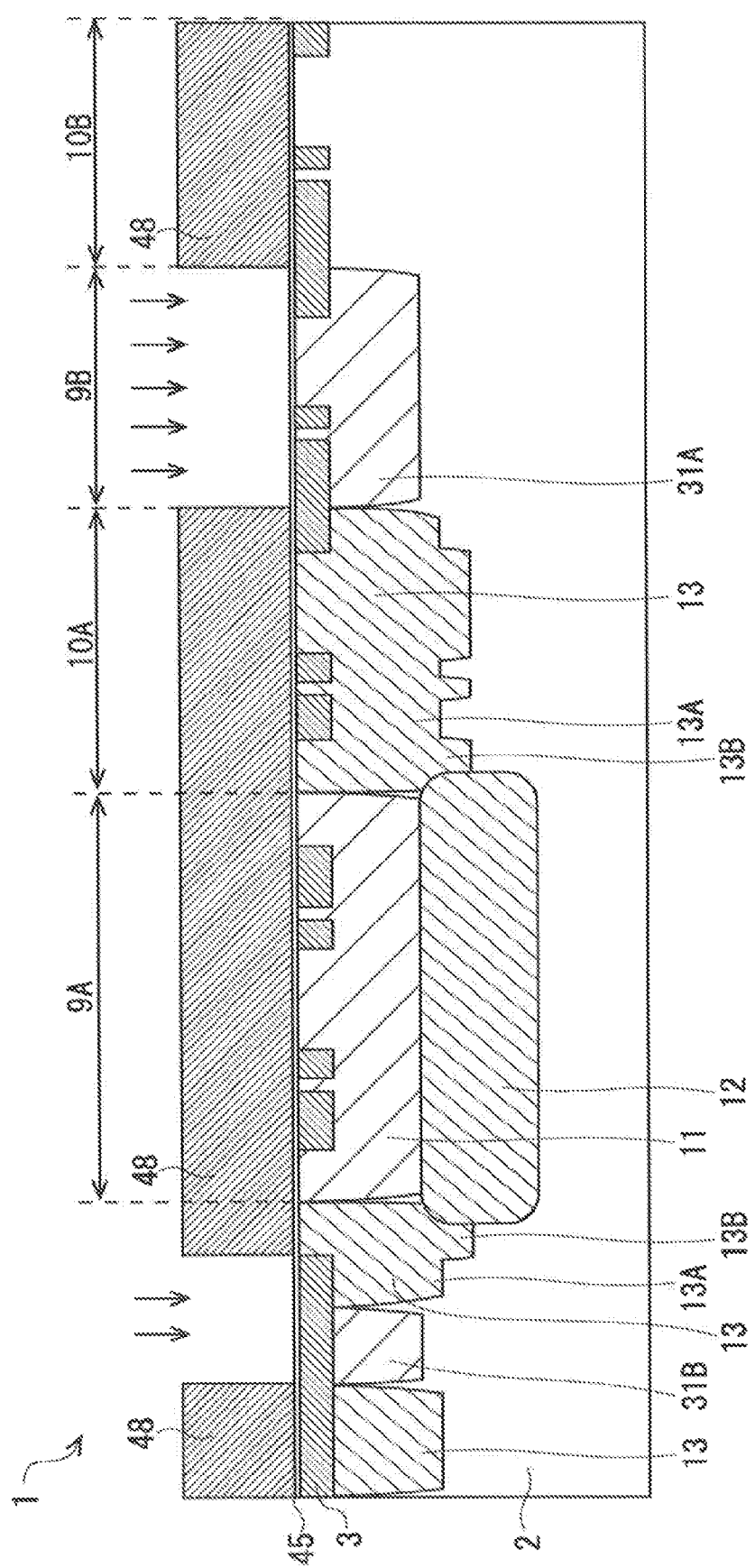
FIG. 7 is a cross-sectional view (sixth of 17 views) illustrating a step of the method for manufacturing a semiconductor device according to the embodiment.

As illustrated in FIG. 6, the HVNW 13 is shallowly formed underneath each place of the semiconductor substrate 2 where the element-isolating insulating film 3 is formed, whereas the HVNW 13 is deeply formed underneath each place where the element-isolating insulating film 3 is not formed. That is, a shallow region 13A of the HVNW 13 is formed underneath each place of the semiconductor substrate 2 where the element-isolating insulating film 3 is formed, whereas a deep region 13B of the HVNW 13 is formed underneath each place where the element-isolating insulating film 3 is not formed.

The element-isolating insulating film 3 is not formed on the connecting part (boundary) between the HVPW 11 and the HVNW 13. That is, an opening for the deep region 13B of the HVNW 13 to be formed in is provided in the element-isolating insulating film 3, and the opening of the element-isolating insulating film 3 is positioned at the connecting part between the HVPW 11 and the HVNW 13. Ion implantation at the time of forming the HVNW 13 within semiconductor substrate 2 is performed at a tilt angle at which channeling can take place. The tilt angle at which channeling can take place is, for example, 0°. Ion implantation may be performed, however, at tilt angles, other than 0°, at which channeling can also take place. Here, channeling refers to a rise in the probability of ions being implanted deep into a crystal when ion implantation is performed from the direction of a crystal-structural substrate in which atoms are sparse.

The impurities are implanted from the opening of the element-isolating insulating film 3 (the place where the element-isolating insulating film 3 is not formed) into a deep position within the semiconductor substrate 2, thereby forming the HVNW 13 up to the deep position. Accordingly, the deep region 13B of the HVNW 13 is formed underneath the connecting part between the HVPW 11 and the HVNW 13. The deep region 13B of the HVNW 13 is connected to the DNW 12. The HVNW 13 is formed up to the deep position, thereby increasing the area of the connecting part between the DNW 12 and the HVNW 13 and decreasing the resistance between the DNW 12 and the HVNW 13.

Thereafter, the photoresist film 47 is removed by, for example, asking. Next, in a step illustrated in FIG. 7, a photoresist film 48 is formed on the semiconductor substrate 2 by photolithography. In the step illustrated in FIG. 7, P-type impurities are ion-implanted using the photoresist film 48 as a mask to form LVPWs 31A and 31B within the semiconductor substrate 2. The LVPW 31A is formed within the semiconductor substrate 2, so as to abut on the HVNW 13 in the horizontal direction of the HVNW 13. The LVPW 31B is formed within the semiconductor substrate 2, so as to abut on the shallow region 13A of the HVNW 13 in the horizontal direction of the HVNW 13. The LVPW 31B may be formed between the HVNW 13 and the HVNW 13. The LVPWs 31A and 31B are formed by ion-implanting, for example, boron (B) under the condition of an acceleration energy of 75 keV or higher but not higher than 300 keV and an amount of implantation of $1.2\times10^{13}$/m or larger but not larger than $1.0\times10^{14}$/cm². Thereafter, the photoresist film 48 is removed by, for example, asking.

Figure 8:
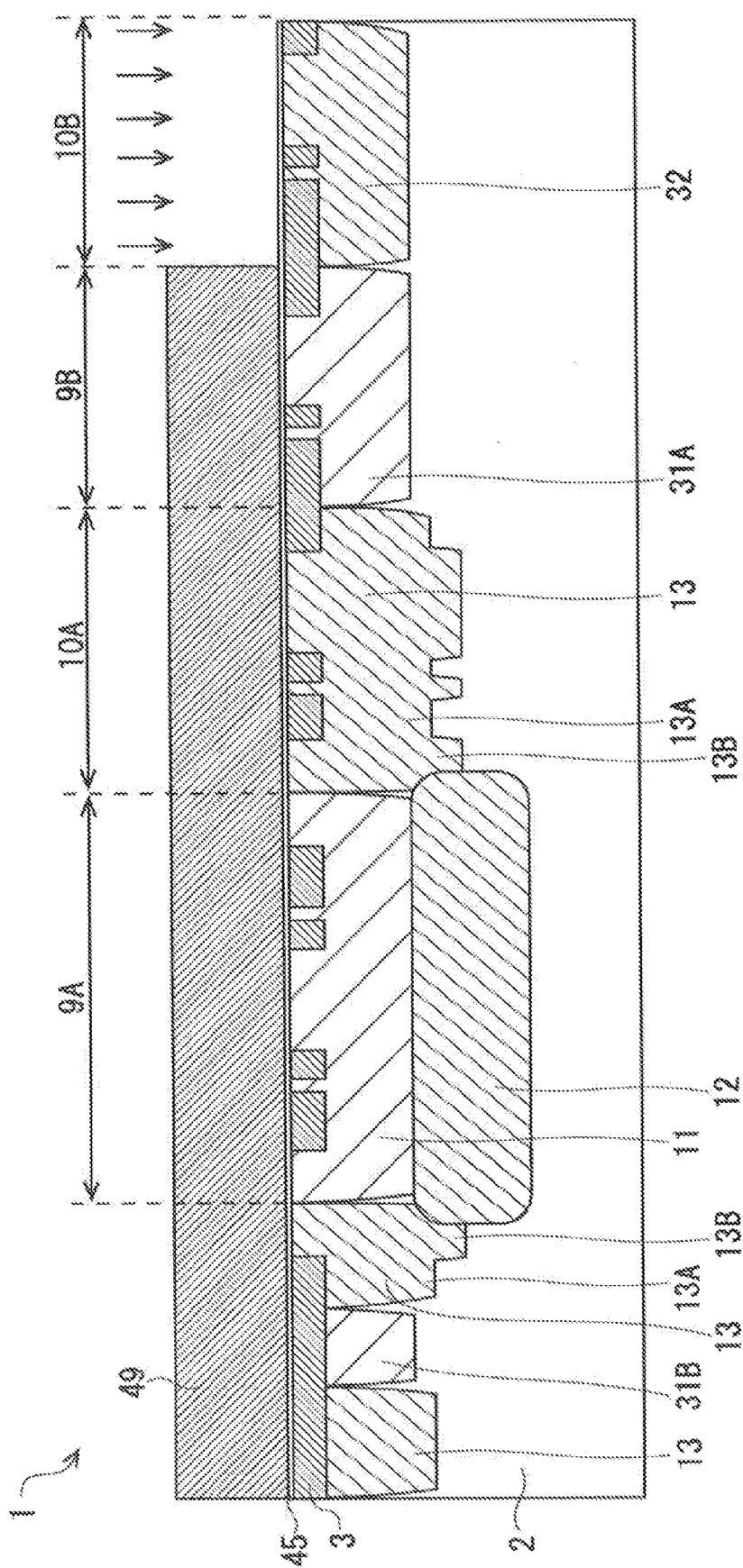
FIG. 8 is a cross-sectional view (seventh of 17 views) illustrating a step of the method for manufacturing a semiconductor device according to the embodiment.

Subsequently, in a step illustrated in FIG. 8, a photoresist film 49 is formed on the semiconductor substrate 2 by photolithography. In the step illustrated in FIG. 8, N-type impurities are ion-implanted using the photoresist film 49 as a mask to form a LVNW 32 within the semiconductor substrate 2. For example, the LVNW 32 is formed within the semiconductor substrate 2, so as to abut on the LVPW 31A in the horizontal direction of the LVPW 31A. The LVNW 32 is formed by ion-implanting, for example, phosphorus (P) under the condition of an acceleration energy of 120 keV or higher but not higher than 700 keV and an amount of implantation of $1.2\times10^{13}$/cm² or larger but not larger than $1.0\times10^{14}$/cm². Thereafter, the photoresist film 49 is removed by, for example, asking.

Figure 9:
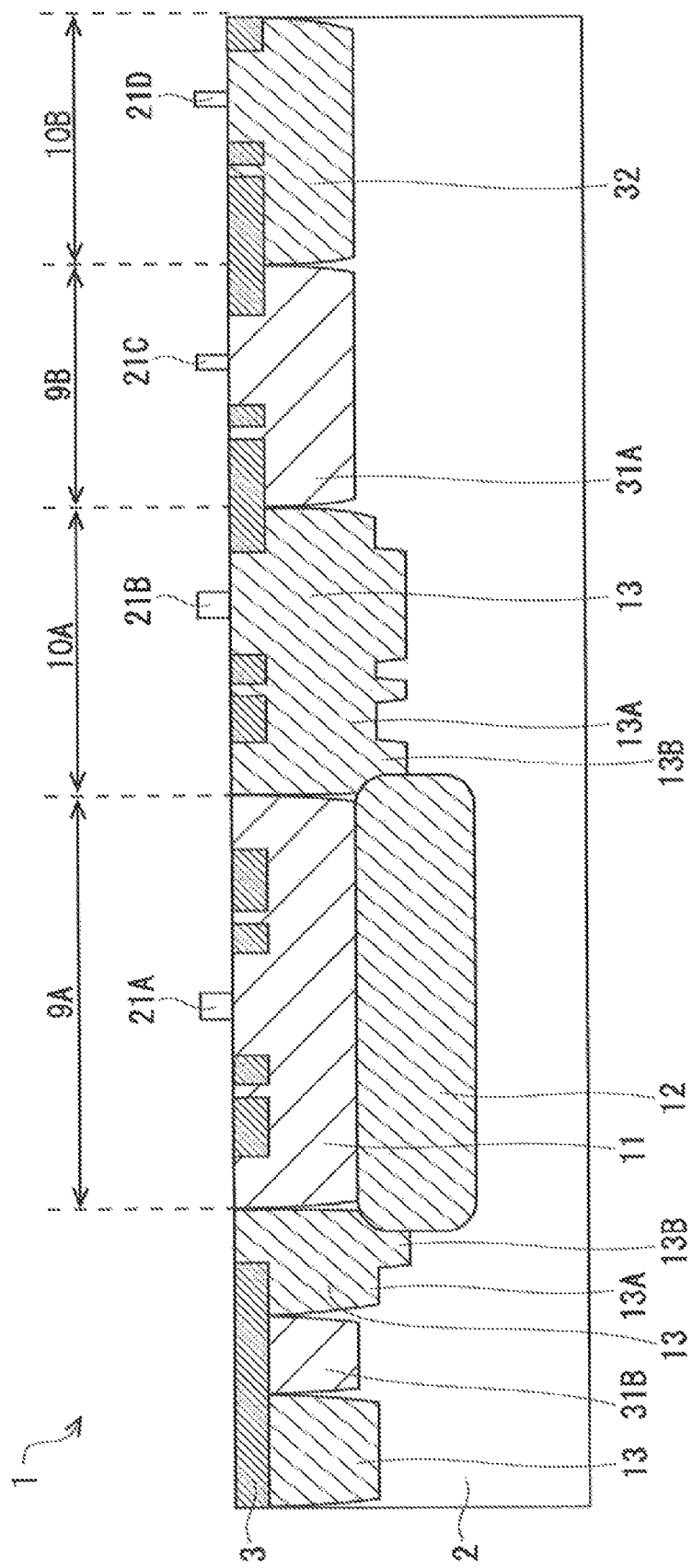
FIG. 9 is a cross-sectional view (eighth of 17 views) illustrating a step of the method for manufacturing a semiconductor device according to the embodiment.

Next, in a step illustrated in FIG. 9, the silicon oxide film 45 is removed, and then a gate insulating film (not illustrated) and gate electrodes 21A to 21D are formed on the semiconductor substrate 2. The gate insulating film is formed immediately underneath the gate electrodes 21A to 21D. A silicon oxide film is formed on the semiconductor substrate 2 by, for example, a thermal oxidation method, and a polysilicon film is formed on the silicon oxide film by a CVD method. Thereafter, the silicon oxide film and the polysilicon film are patterned by photolithography and dry etching to form the gate insulating film and the gate electrodes 21A to 21D on the semiconductor substrate 2.

Figure 10:
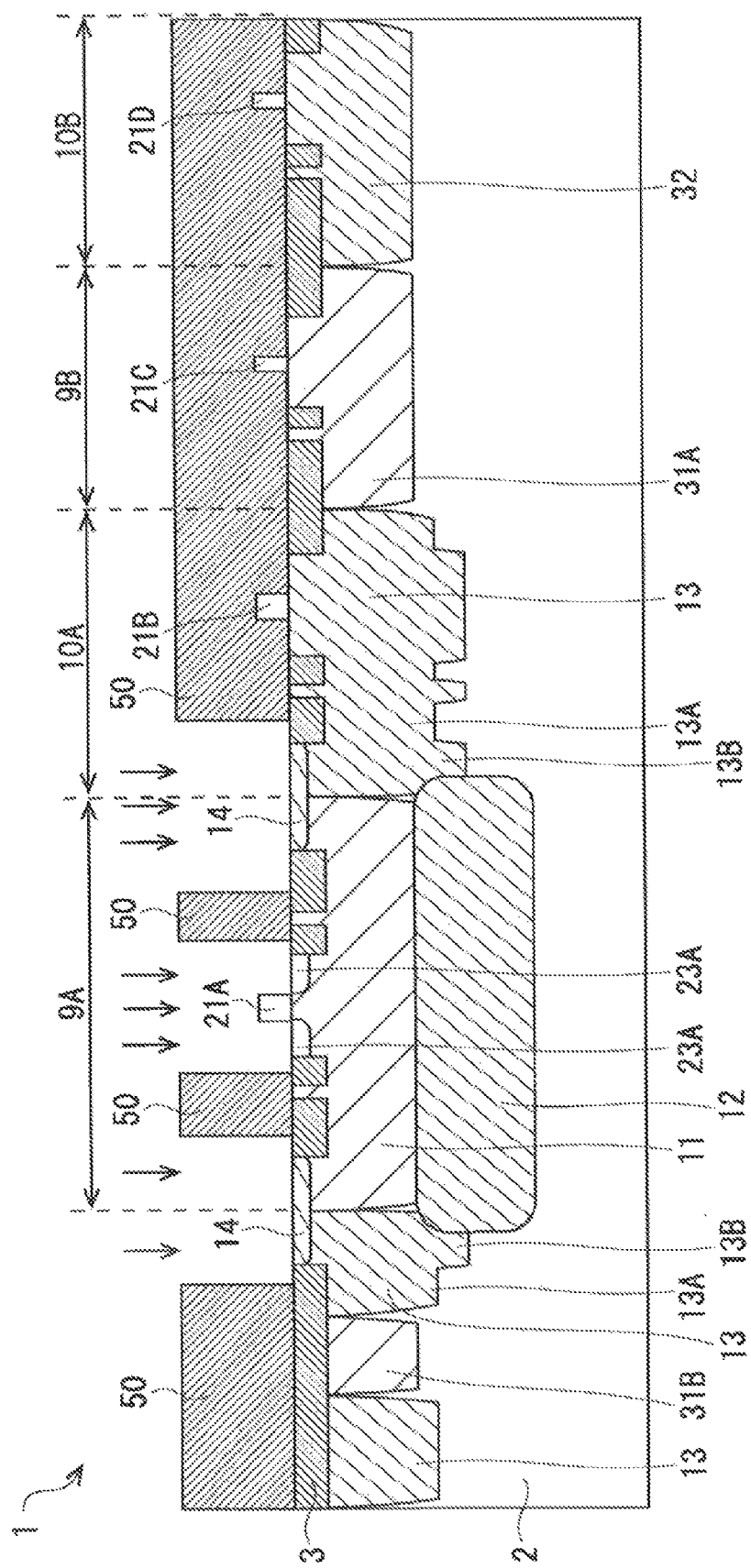
FIG. 10 is a cross-sectional view (ninth of 17 views) illustrating a step of the method for manufacturing a semiconductor device according to the embodiment.

Subsequently, in a step illustrated in FIG. 10, a photoresist film 50 is formed on the semiconductor substrate 2 by photolithography. In the step illustrated in FIG. 10, N-type impurities are ion-implanted using the gate electrode 21A and the photoresist film 50 as a mask to form an impurity layer 14 on the upper portion of the connecting part between the HVPW 11 and the HVNW 13 and an LDD region 23A within the HVPW 11. N-type impurities are ion-implanted into the entire exposed surface of the semiconductor substrate 2 in the connecting part between the HVPW 11 and the HVNW 13, thereby forming the impurity layer 14 on the entire exposed surface of the semiconductor substrate 2 in the connecting part between the HVPW 11 and the HVNW 13. The impurity layer 14 and the LDD region 23A are formed by ion-implanting, for example, phosphorus (P) under the condition of an acceleration energy of 1 keV or higher but not higher than 80 keV and an amount of implantation of $2.0\times10^{12}$/cm² or larger but not larger than $1.0\times10^{15}$/cm². Thereafter, the photoresist film 50 is removed by, for example, asking.

Figure 11:
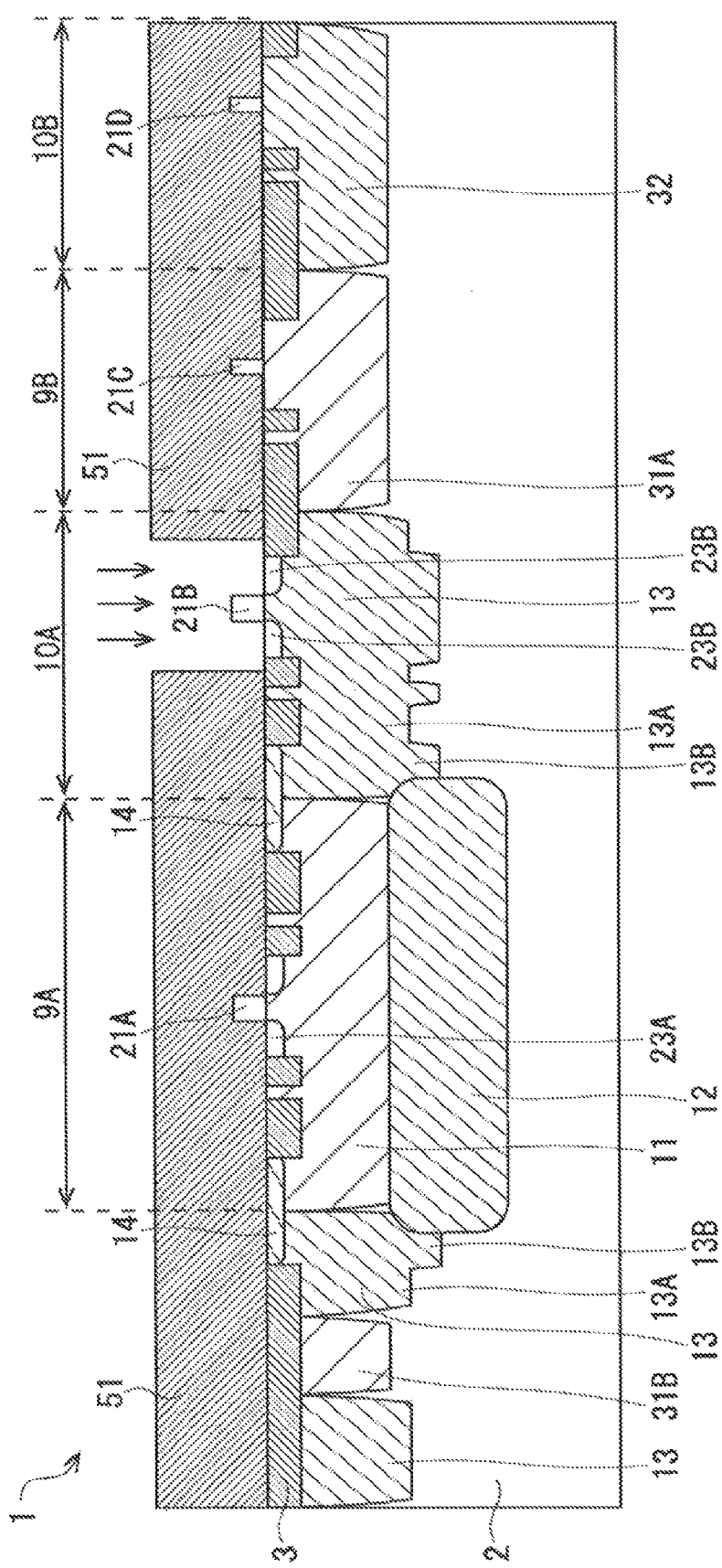
FIG. 11 is a cross-sectional view (tenth of 17 views) illustrating a step of the method for manufacturing a semiconductor device according to the embodiment.

Next, in a step illustrated in FIG. 11, a photoresist film 51 is formed on the semiconductor substrate 2 by photolithography. In the step illustrated in FIG. 11, P-type impurities are ion-implanted using the gate electrode 21B and the photoresist film 51 as a mask to form an LDD region 23B within the HVNW 13. The LDD region 23B is formed by ion-implanting, for example, boron (B) under the condition of an acceleration energy of 0.5 keV or higher but not higher than 60 keV and an amount of implantation of $2.0\times10^{12}$/cm² or larger but not larger than $1.0\times10^{15}$/cm². Thereafter, the photoresist film 51 is removed by, for example, asking.

Figure 12:
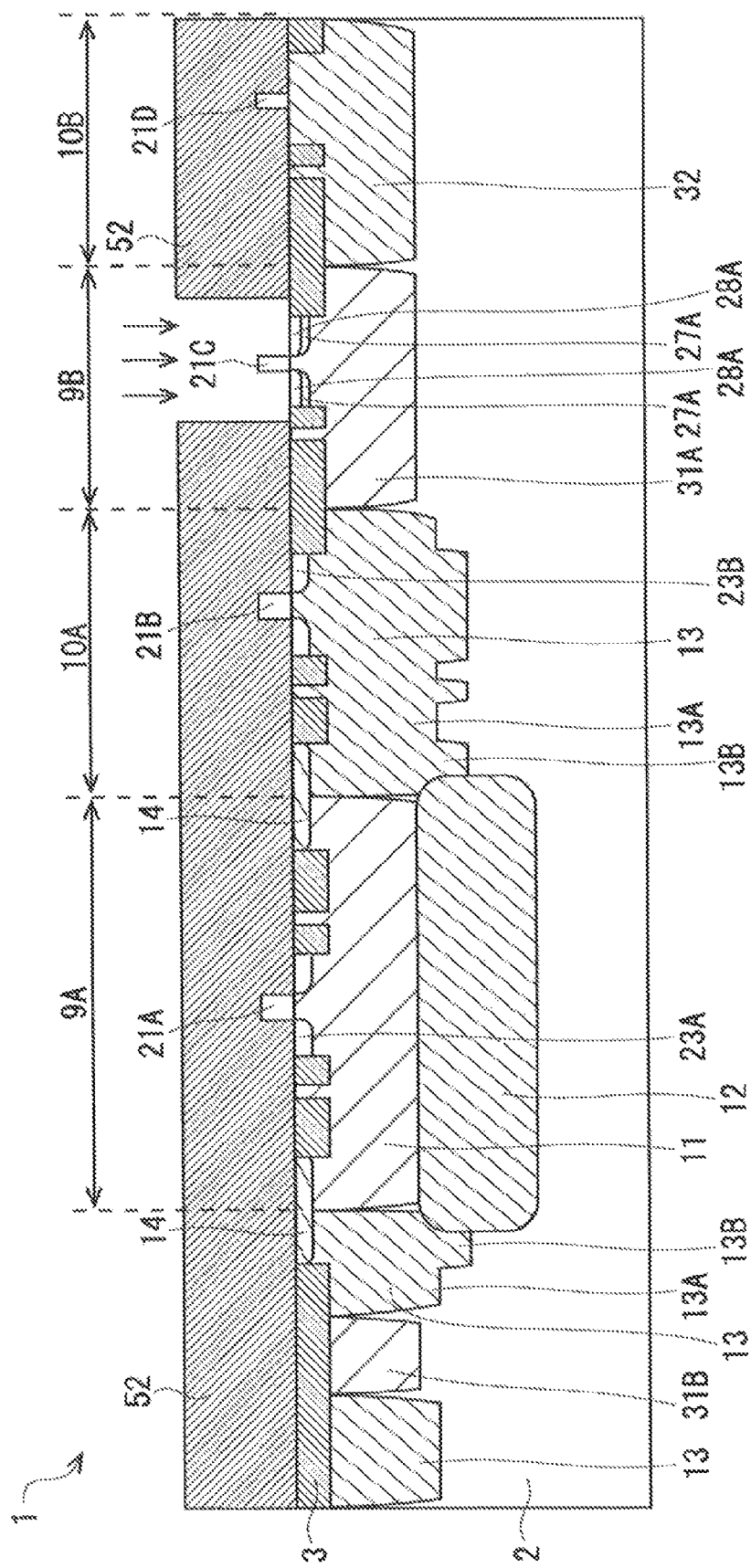
FIG. 12 is a cross-sectional view (eleventh of 17 views) illustrating a step of the method for manufacturing a semiconductor device according to the embodiment.

Subsequently, in a step illustrated in FIG. 12, a photoresist film 52 is formed on the semiconductor substrate 2 by photolithography. In the step illustrated in FIG. 12, P-type impurities are ion-implanted using the gate electrode 21C and the photoresist film 52 as a mask to form a pocket region 27A within the LVPW 31A. In the step illustrated in FIG. 12, N-type impurities are ion-implanted using the gate electrode 21C and the photoresist film 52 as a mask to form an extension region 28A within the LVPW 31A. The pocket region 27A is formed by ion-implanting, for example, indium (In) under the condition of an acceleration energy of 10 keV or higher but not higher than 80 keV and an amount of implantation of $1.0\times10^{12}$/cm² or larger but not larger than $1.0\times10^{15}$/cm². The extension region 28A is formed by ion-implanting, for example, arsenic (As) under the condition of an acceleration energy of 0.5 keV or higher but not higher than 10 keV and an amount of implantation of $1.0\times10^{13}$/cm² or larger but not larger than $1.0\times10^{16}$/cm². Thereafter, the photoresist film 52 is removed by, for example, ashing.

Figure 13:
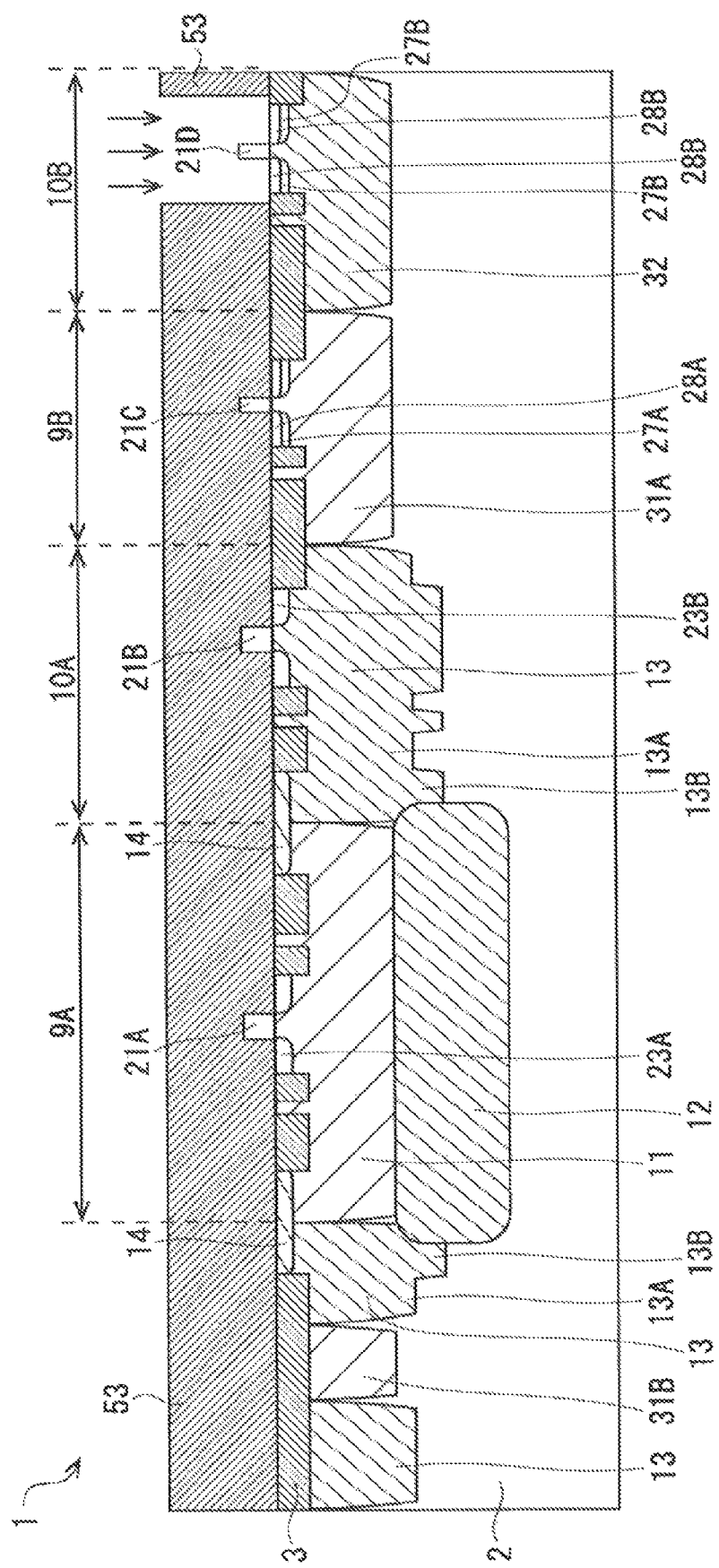
FIG. 13 is a cross-sectional view (twelfth of 17 views) illustrating a step of the method for manufacturing a semiconductor device according to the embodiment.

Next, in a step illustrated in FIG. 13, a photoresist film 53 is formed on the semiconductor substrate 2 by photolithography. In the step illustrated in FIG. 13, N-type impurities are ion-implanted using the gate electrode 21D and the photoresist film 53 as a mask to form a pocket region 27B within the LVNW 32. In the step illustrated in FIG. 13, P-type impurities are ion-implanted using the gate electrode 21D and the photoresist film 53 as a mask to form an extension region 28B within the LVNW 32. The pocket region 27B is formed by ion-implanting, for example, phosphorus (P) under the condition of an acceleration energy of 10 keV or higher but not higher than 80 keV and an amount of implantation of $1.0 \times 10^{12}/\text{cm}^2$ or larger but not larger than $1.0 \times 10^{15}/\text{cm}^2$. The extension region 28B is formed by ion-implanting, for example, boron (B) under the condition of an acceleration energy of 0.1 keV or higher but not higher than 5 keV and an amount of implantation of $1.0 \times 10^{13}/\text{cm}^2$ or larger but not larger than $1.0 \times 10^{16}/\text{cm}^2$. Thereafter, the photoresist film 53 is removed by, for example, ashing.

Figure 14:
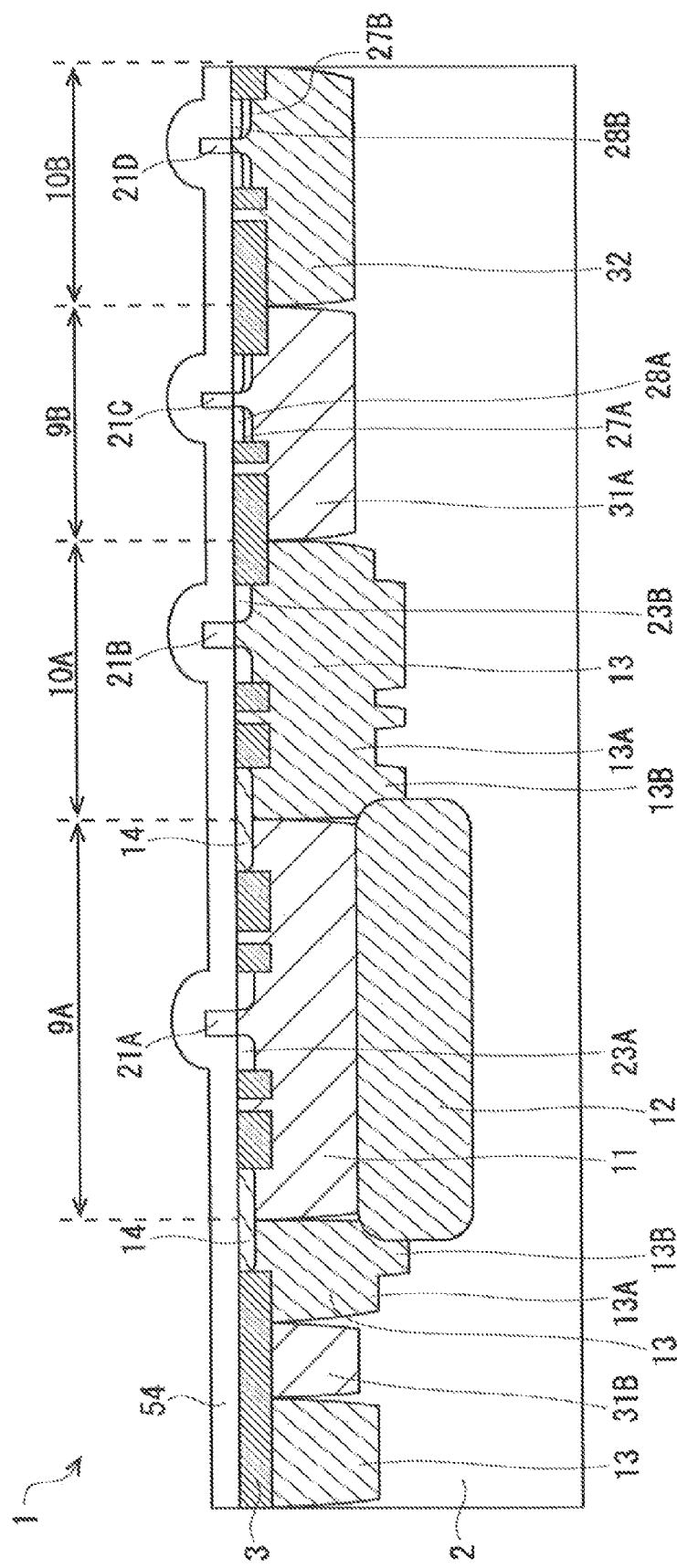
FIG. 14 is a cross-sectional view (thirteenth of 17 views) illustrating a step of the method for manufacturing a semiconductor device according to the embodiment.
Figure 15:
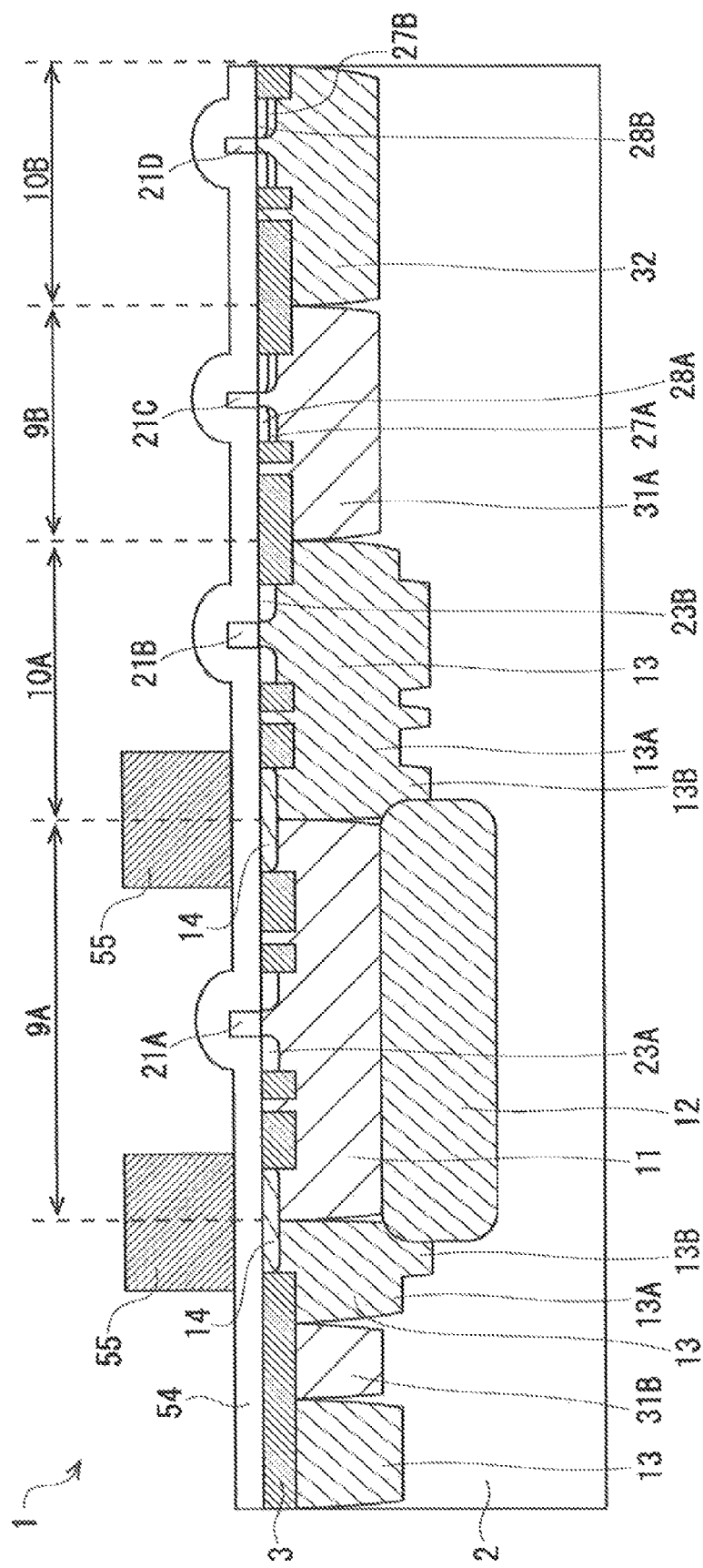
FIG. 15 is a cross-sectional view (fourteenth of 17 views) illustrating a step of the method for manufacturing a semiconductor device according to the embodiment.

Subsequently, in a step illustrated in FIG. 14, a silicon oxide film 54 is deposited on the entire surface of the semiconductor substrate 2 by, for example, a CVD method. Next, in a step illustrated in FIG. 15, a photoresist film 55 for covering the impurity layer 14 is formed on the silicon oxide film 54 by photolithography.

Figure 16:
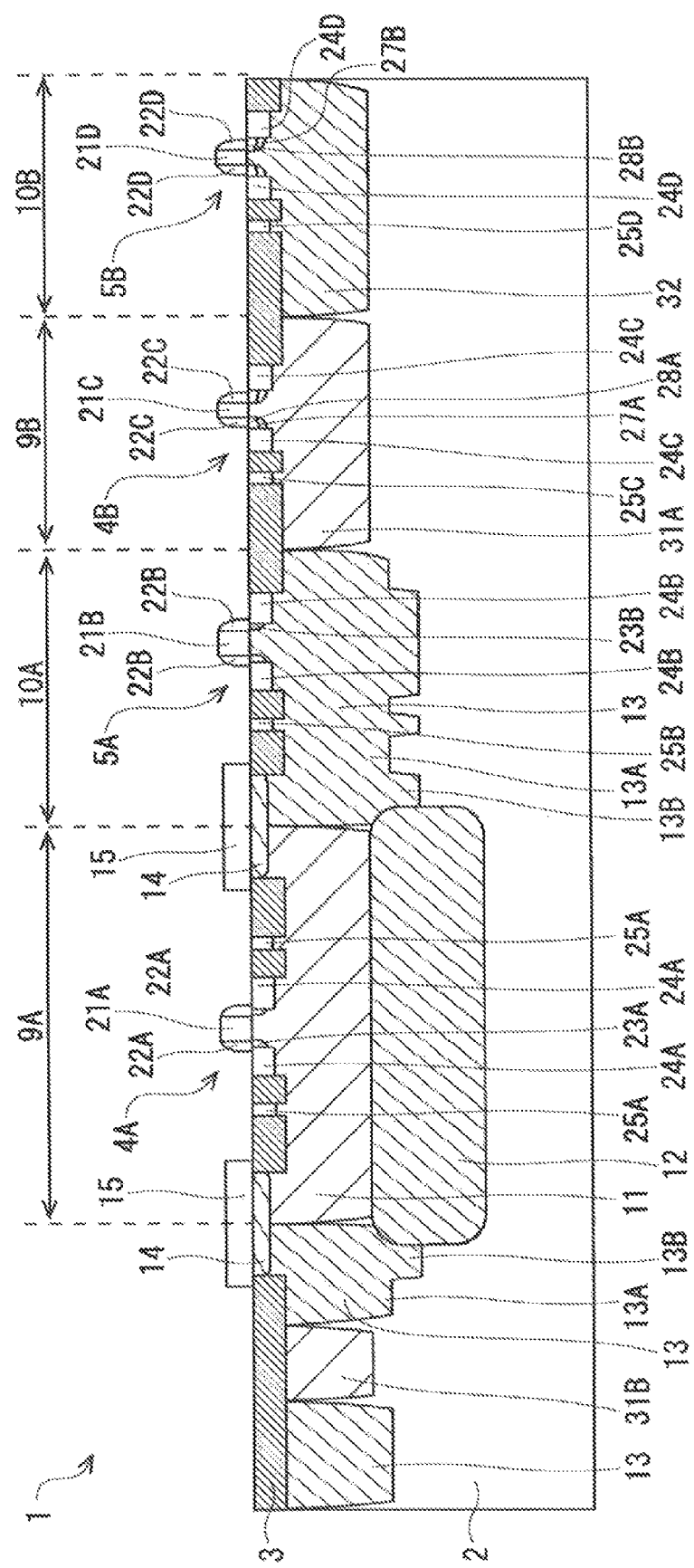
FIG. 16 is a cross-sectional view (fifteenth of 17 views) illustrating a step of the method for manufacturing a semiconductor device according to the embodiment.

In a step illustrated in FIG. 16, dry etching is performed using the photoresist film 55 as a mask to pattern the silicon oxide film 54 deposited on the entire surface of the semiconductor substrate 2. As the result of the silicon oxide film 54 deposited on the entire surface of the semiconductor substrate 2 being patterned, a silicide block layer 15 for covering the impurity layer 14 is formed on the semiconductor substrate 2. Sidewall insulating films 22A to 22D are self-alignedly formed on the side surfaces of the gate electrodes 21A to 21D. Thereafter, the photoresist film 55 is removed by, for example, asking.

In the step illustrated in FIG. 16, a photoresist film (not illustrated) whose places where source/drain regions 24A and 24C are to be formed are opened is formed on the semiconductor substrate 2 by photolithography. In the step illustrated in FIG. 16, N-type impurities are ion-implanted using the gate electrodes 21A and 21C, the sidewall insulating film 22A and 22C, and the photoresist film as a mask. As the result of the N-type impurities being ion-implanted, the source/drain regions 24A are formed within the HVPW 11 and the source/drain regions 24C are formed within the LVPW 31A. Thereafter, the photoresist film is removed by, for example, ashing.

In the step illustrated in FIG. 16, a photoresist film (not illustrated) whose places where source/drain regions 24B and 24D are to be formed are opened is formed on the semiconductor substrate 2 by photolithography. In the step illustrated in FIG. 16, P-type impurities are ion-implanted using the gate electrodes 21B and 21D, the sidewall insulating films 22B and 22D and the photoresist film as a mask. As the result of the P-type impurities being ion-implanted, the source/drain regions 24B are formed within the HVNW 13 and the source/drain regions 24D are formed within the LVNW 32. Thereafter, the photoresist film is removed by, for example, ashing.

In the step illustrated in FIG. 16, a photoresist film (not illustrated) whose places where tap regions 25A and 25C are to be formed are opened is formed on the semiconductor substrate 2 by photolithography. In the step illustrated in FIG. 16, P-type impurities are ion-implanted using the photoresist film as a mask. As the result of the P-type impurities being ion-implanted, the tap regions 25A are formed within the HVPW 11 and the tap region 25C is formed within the LVPW 31A. Thereafter, the photoresist film is removed by, for example, ashing.

In the step illustrated in FIG. 16, a photoresist film (not illustrated) whose places where tap regions 25B and 25D are to be formed are opened is formed on the semiconductor substrate 2 by photolithography. In the step illustrated in FIG. 16, N-type impurities are ion-implanted using the photoresist film as a mask. As the result of the N-type impurities being ion-implanted, the tap region 25B is formed within the HVNW 13 and the tap region 25D is formed within the LVNW 32. Thereafter, the photoresist film is removed by, for example, ashing.

Figure 17:
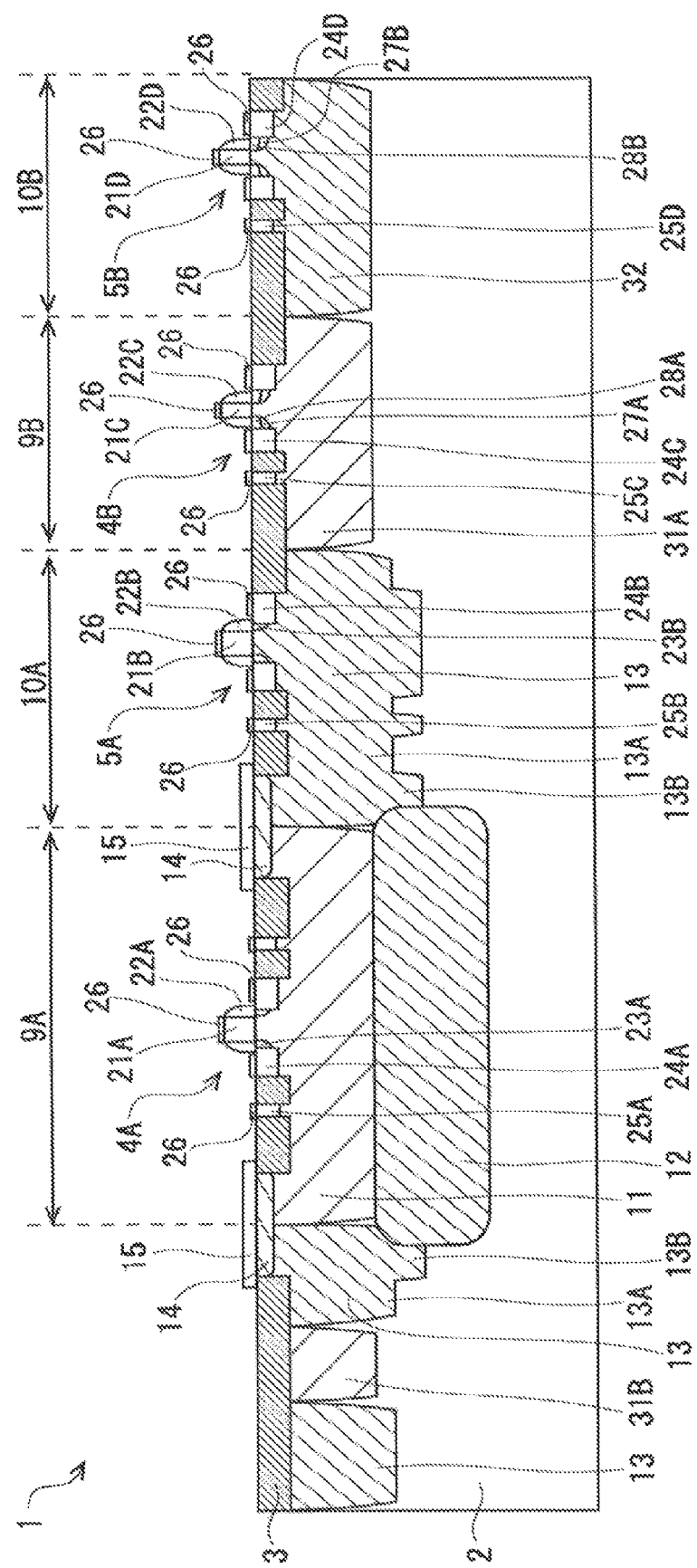
FIG. 17 is a cross-sectional view (sixteenth of 17 views) illustrating a step of the method for manufacturing a semiconductor device according to the embodiment.

In a step illustrated in FIG. 17, a metal film of, for example, such as titanium (Ti), cobalt (Co) or nickel (Ni) is formed on the entire surface of the semiconductor substrate 2, and then a heat treatment is performed. Consequently, metal silicide layers 26 are formed on the gate electrodes 21A to 21D, the source/drain regions 24A to 24D and the tap regions 25A to 25D. Since the silicide block layer 15 is formed so as to cover the impurity layer 14, metal silicide layers 26 are not formed on the impurity layer 14. It is therefore possible to prevent the HVPW 11 and the HVNW 13 from short-circuiting to each other through the metal silicide layers 26. Unreacted metal films are selectively removed by, for example, chemical solution treatment.

Figure 18:
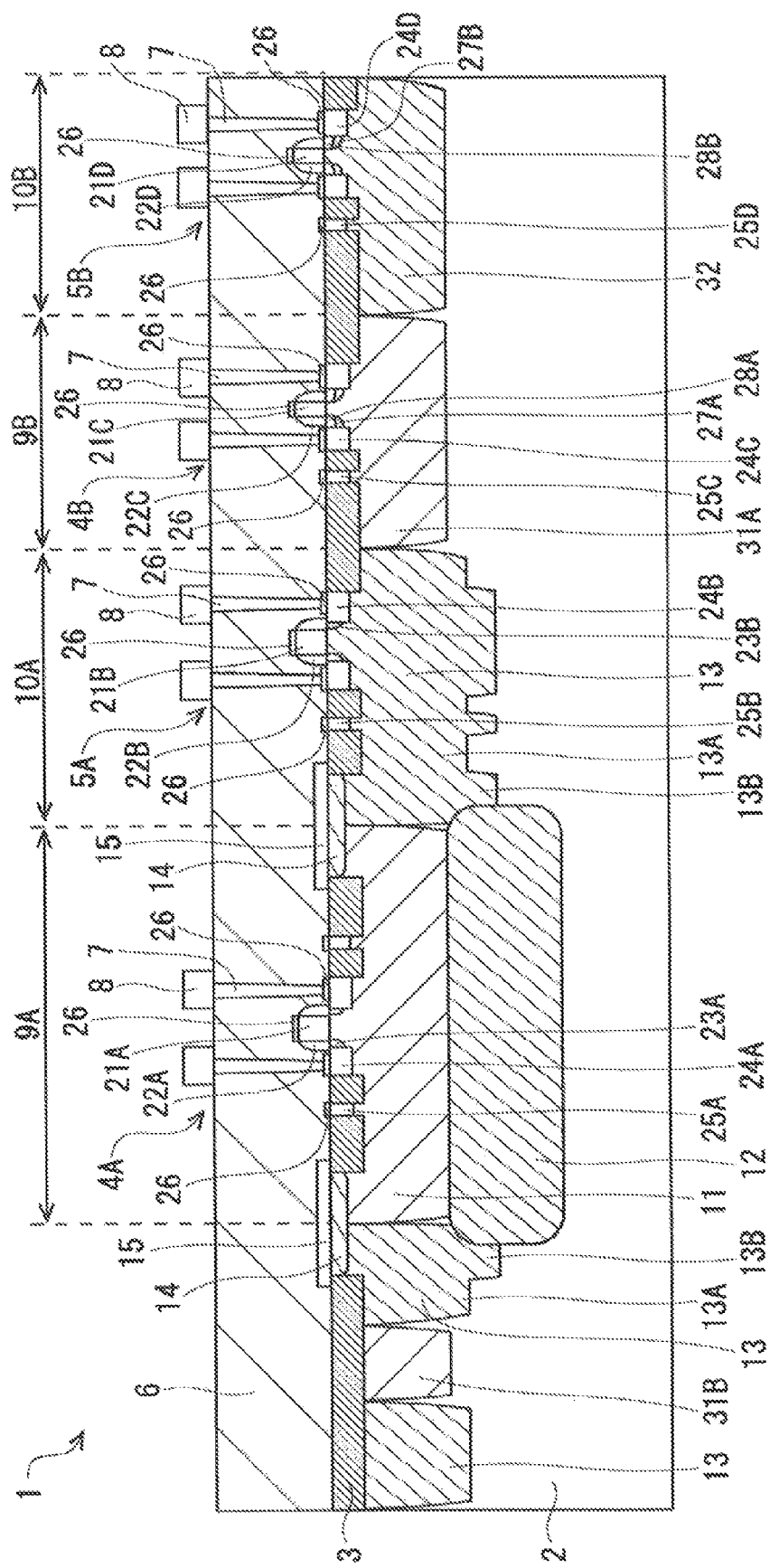
FIG. 18 is a cross-sectional view (seventeenth of 17 views) illustrating a step of the method for manufacturing a semiconductor device according to the embodiment.

In a step illustrated in FIG. 18, a silicon oxide film is deposited on the entire surface of the semiconductor substrate 2 by, for example, a CVD method to form an interlayer insulating film 6 on the semiconductor substrate 2. In the step illustrated in FIG. 18, there is formed a photoresist film (not illustrated) whose places where contact plugs 7 are to be formed are opened. Using the photoresist film as a mask, the interlayer insulating film 6 is dry-etched to form contact holes in the interlayer insulating film 6. The photoresist film is removed by, for example, asking. A titanium nitride (TiN) film and a tungsten (W) film and the like, for example, are deposited in the contact holes of the interlayer insulating film 6 by, for example, a CVD method. Extra titanium nitride film and tungsten film and the like on the interlayer insulating film 6 are removed by CMP to form the contact plugs 7 within the interlayer insulating film 6.

In the step illustrated in FIG. 18, metal films of such as aluminum (Al) and copper (Cu) are formed on the interlayer insulating film 6 by, for example, sputtering. In the step illustrated in FIG. 18, there is formed a photoresist film (not illustrated) whose places where wiring lines 8 are to be formed are opened. Using the photoresist film as a mask, the metal films are dry-etched to form a first layer of wiring lines 8 on the interlayer insulating film 6. The photoresist film is removed by, for example, asking. After the formation of the wiring lines 8, a desired back-end process, such as the formation of a second and subsequent layers of wiring lines, is carried out to manufacture the semiconductor device 1.

In the foregoing embodiment, there is cited one example of the semiconductor device 1 whose HVNW 13 includes the shallow region 13A and the deep region 13B and the method for manufacturing the semiconductor device 1. The embodiment is not limited to this example, however. Alternatively, n and p conductivity types may be reversed so that the HVPW 11 includes a shallow region and a deep region, and the deep region of the HVPW 11 may be connected to a DPW (Deep P Well) formed underneath the HVNW 13.

The above-described embodiment may be modified as described below. That is, Modified Examples 1 to 5 to be described below may be combined and applied to a semiconductor device according to the embodiment and a method for manufacturing the semiconductor device.

Modified Example 1

In the foregoing embodiment, an example has been cited in which the impurity layer 14 and the silicide block layer 15 have an annular shape, in plan view, extended along the connecting part between the HVPW 11 and the HVNW 13. The embodiment is not limited to this example, however. The impurity layer 14 and the silicide block layer 15 may have a rectangular shape, an elliptical shape or a circular shape striding over part of the connecting part between the HVPW 11 and the HVNW 13.

Figure 19A:
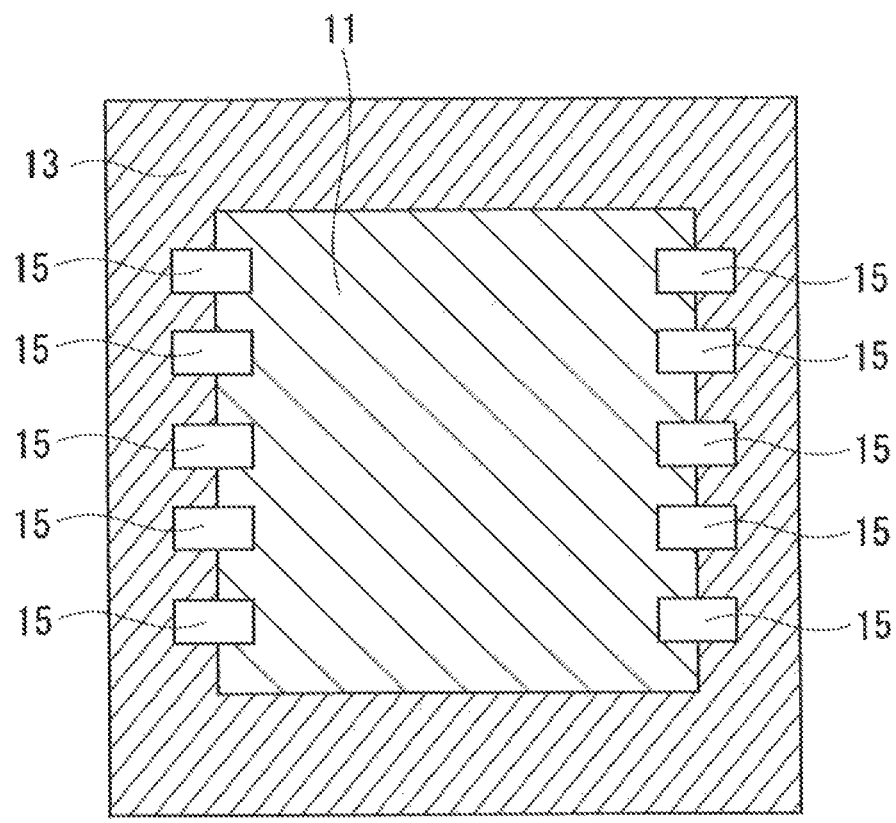
FIG. 19A is a plan view of the semiconductor device.

For example, a plurality of impurity layers 14 and a plurality of silicide block layers 15 may stride over parts of the connecting part between the HVPW 11 and the HVNW 13, as illustrated in FIG. 19A. FIG. 19A is a plan view of the semiconductor device 1. In FIG. 19A, the HVPW 11, the HVNW 13 and the silicide block layers 15 of Modified Example 1 are illustrated but other constituent elements are omitted from the illustration. The silicide block layers 15 are formed so as to cover the impurity layers 14 formed on the upper portion of the connecting part between the HVPW 11 and the HVNW 13. Since the impurity layers 14 are covered with the silicide block layers 15, the impurity layers 14 are hidden by the silicide block layers 15 in FIG. 19A. Portions of the connecting part between the HVPW 11 and the HVNW 13 not covered with the silicide block layers 15 are covered with an element-isolating insulating film 3 (not illustrated). The impurity layer 14 and the silicide block layers 15 are formed along the connecting part between the HVPW 11 and the HVNW 13, in plan view, while being separated from each other. The connecting part between the HVPW 11 and the HVNW 13 is covered with the silicide block layers 15 and the element-isolating insulating film 3 (not illustrated). Accordingly, it is possible, also in Modified Example 1, to prevent the formation of a metal silicide layer 26 which causes the HVPW 11 and the HVNW 13 to short-circuit to each other.

Figure 19B:
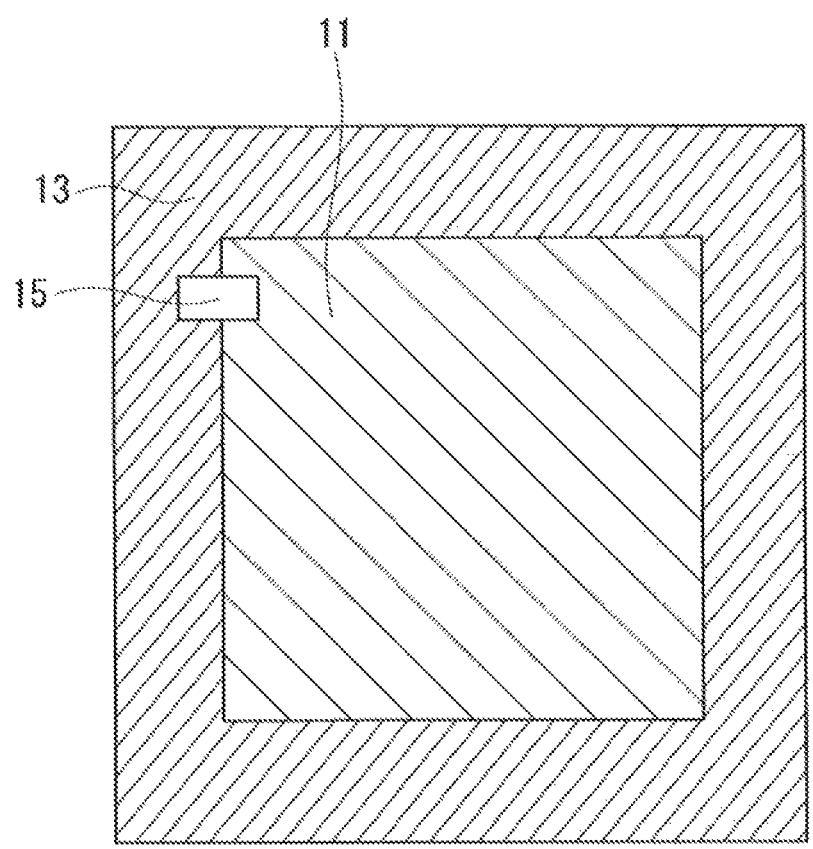
FIG. 19B is a plan view of the semiconductor device.

For example, one impurity layer 14 and one silicide block layer 15 may stride over part of the connecting part between the HVPW 11 and the HVNW 13 and the rest of the connecting part may be covered with the element-isolating insulating film 3 (not illustrated), as illustrated in FIG. 19B. FIG. 19B is a plan view of the semiconductor device 1. In FIG. 19B, some constituent elements of the semiconductor device 1 are omitted from the illustration. The silicide block layer 15 is formed so as to cover the impurity layer 14 formed on the upper portion of the connecting part between the HVPW 11 and the HVNW 13. Since the impurity layer 14 is covered with the silicide block layer 15, the impurity layer 14 is hidden by the silicide block layer 15 in FIG. 19B. In the example illustrated in FIG. 19B, one impurity layer 14 and one silicide block layer 15 are formed so as to stride over part of the connecting part between the HVPW 11 and the HVNW 13 in plan view.

Modified Example 2

Figure 20:
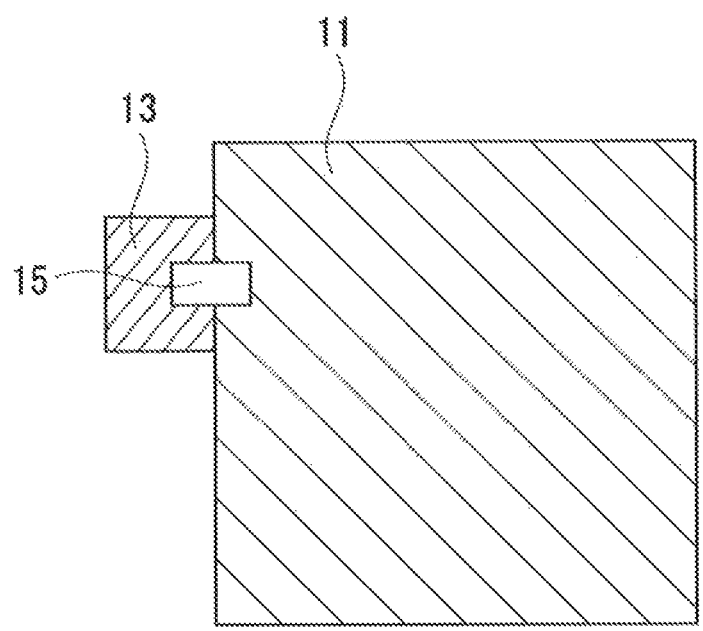
FIG. 20 is a plan view of the semiconductor device.

In the foregoing embodiment, an example is cited in which the HVNW 13 is formed within the semiconductor substrate 2, so as to surround the HVPW 11 in the horizontal direction thereof. The embodiment is not limited to this example, however. The HVNW 13 may be formed within the semiconductor substrate 2, so as to have contact with part of the HVPW 11 in the horizontal direction thereof. For example, the HVNW 13 may be formed within the semiconductor substrate 2, so as to have contact with part of the HVPW 11 in the horizontal direction thereof, as illustrated in FIG. 20. FIG. 20 is a plan view of the semiconductor device 1. In FIG. 20, the HVPW 11, the HVNW 13 and the silicide block layer 15 of Modified Example 2 are illustrated, but other constituent elements are omitted from the illustration.

The silicide block layer 15 is formed so as to cover the impurity layer 14 formed on the upper portion of the connecting part between the HVPW 11 and the HVNW 13. In addition, portions of the outer circumference of the HVPW 11 where the silicide block layer 15 is not formed are covered with the element-isolating insulating film 3 (not illustrated). Accordingly, it is possible, also in Modified Example 2, to prevent the formation of a metal silicide layer 26 which causes the HVPW 11 and the HVNW 13 to short-circuit to each other. Since the impurity layer 14 is covered with the silicide block layer 15, the impurity layer 14 is hidden by the silicide block layer 15 in FIG. 20. In the example illustrated in FIG. 20, one impurity layer 14 and one silicide block layer 15 are formed so as to stride over part of the connecting part between the HVPW 11 and the HVNW 13 in plan view.

Modified Example 3

In the foregoing embodiment, an example is cited in which N-type impurities are ion-implanted to form the impurity layer 14 on the upper portion of the connecting part between the HVPW 11 and the HVNW 13. The embodiment is not limited to this example, however. P-type impurities may be ion-implanted to form the impurity layer 14 on the upper portion of the connecting part between the HVPW 11 and the HVNW 13. In this case, the photoresist film 50 is formed so as to cover the entire exposed surface of the semiconductor substrate 2 in the connecting part between the HVPW 11 and the HVNW 13 in the step illustrated in FIG. 10. Consequently, the N-type impurities are prevented from being implanted into the exposed surface of the semiconductor substrate 2 in the connecting part between the HVPW 11 and the HVNW 13.

In the step illustrated in FIG. 11, a photoresist film 51 through which the exposed surface of the semiconductor substrate 2 in the connecting part between the HVPW 11 and the HVNW 13 is opened is formed on the semiconductor substrate 2 by photolithography. In the step illustrated in FIG. 11, the P-type impurities are ion-implanted using the gate electrode 21B and the photoresist film 51 as a mask to form the impurity layer 14 on the upper portion of the connecting part between the HVPW 11 and the HVNW 13, and to form an LDD region 23B within the HVNW 13. The impurity layer 14 is formed on the entire exposed surface of the semiconductor substrate 2 in the connecting part between the HVPW 11 and the HVNW 13 by ion-implanting the P-type impurities into the entire exposed surface of the semiconductor substrate 2 in the connecting part between the HVPW 11 and the HVNW 13.

Modified Example 4

Figure 21:
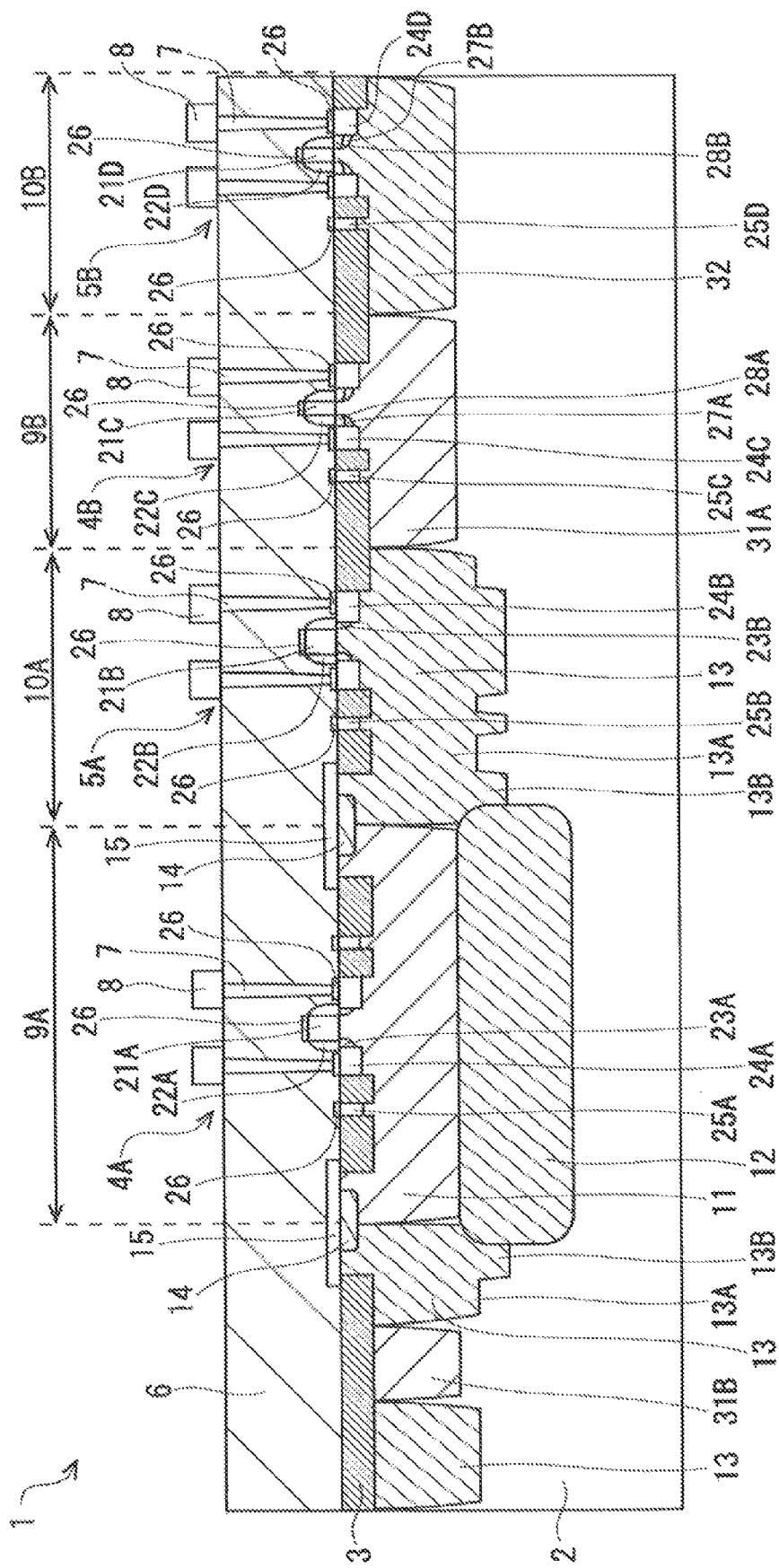
FIG. 21 is a cross-sectional view of the semiconductor device.

In the foregoing embodiment, an example is cited in which the impurity layer 14 is formed on the entire exposed surface of the semiconductor substrate 2 in the connecting part between the HVPW 11 and the HVNW 13. The embodiment is not limited to this example, however. The impurity layer 14 may be formed on part of the exposed surface of the semiconductor substrate 2 in the connecting part between the HVPW 11 and the HVNW 13, as illustrated in FIG. 21. FIG. 21 is a cross-sectional view of the semiconductor device 1. As the result of the N-type impurities or the P-type impurities being ion-implanted into part of the exposed surface of the semiconductor substrate 2 in the connecting part between the HVPW 11 and the HVNW 13, the impurity layer 14 is formed on part of the exposed surface of the semiconductor substrate 2 in the connecting part between the HVPW 11 and the HVNW 13.

Modified Example 5

In the foregoing embodiment, an example is cited in which the impurity layer 14 is formed on the exposed surface of the semiconductor substrate 2 in the connecting part between the HVPW 11 and the HVNW 13. The embodiment is not limited to this example, however. The impurity layer 14 may be prevented from being formed on the exposed surface of the semiconductor substrate 2 in the connecting part between the HVPW 11 and the HVNW 13. In this case, a photoresist film is formed so as to cover the exposed surface of the semiconductor substrate 2 in the connecting part between the HVPW 11 and the HVNW 13 to prevent the N-type impurities or the P-type impurities from being ion-implanted into the exposed surface of the semiconductor substrate 2 in the connecting part between the HVPW 11 and the HVNW 13.

<Verification>

Figure 23A:
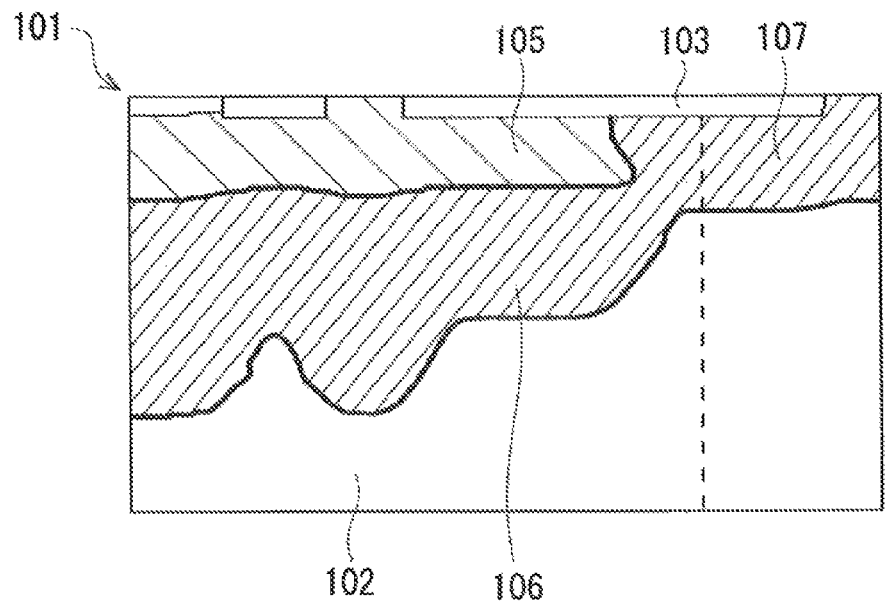
FIG. 23A is a drawing illustrating the results of TCAD simulation.
Figure 23B:
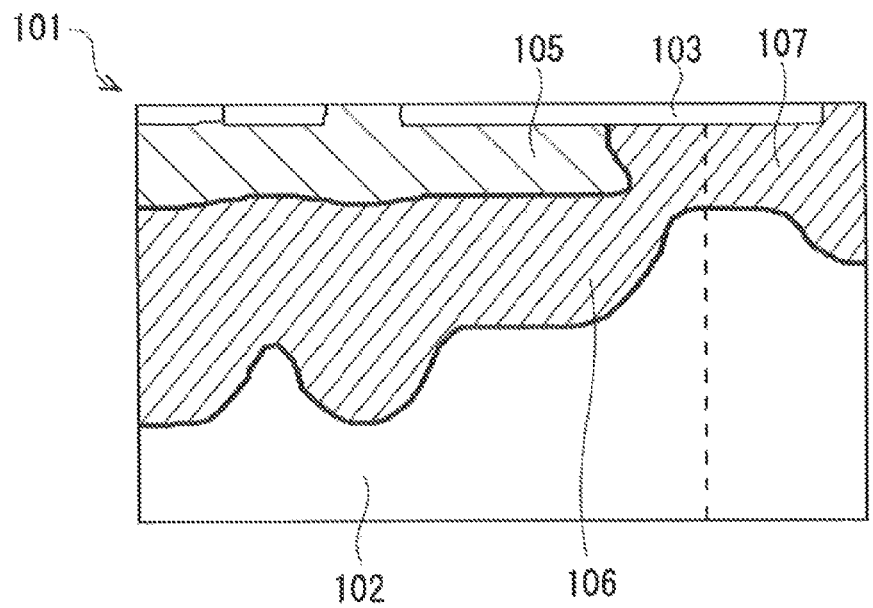
FIG. 23B is a drawing illustrating the results of TCAD simulation.
Figure 23C:
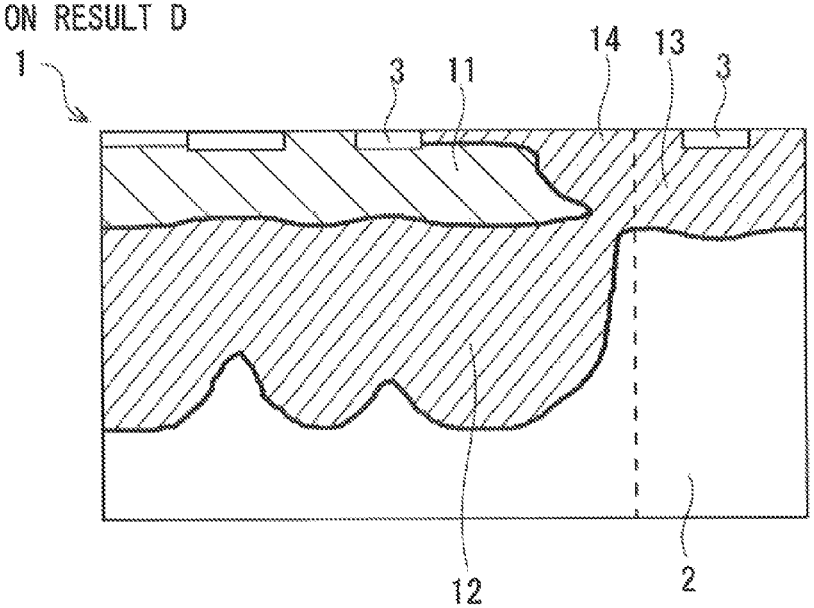
FIG. 23C is a drawing illustrating the results of TCAD simulation.
Figure 23D:
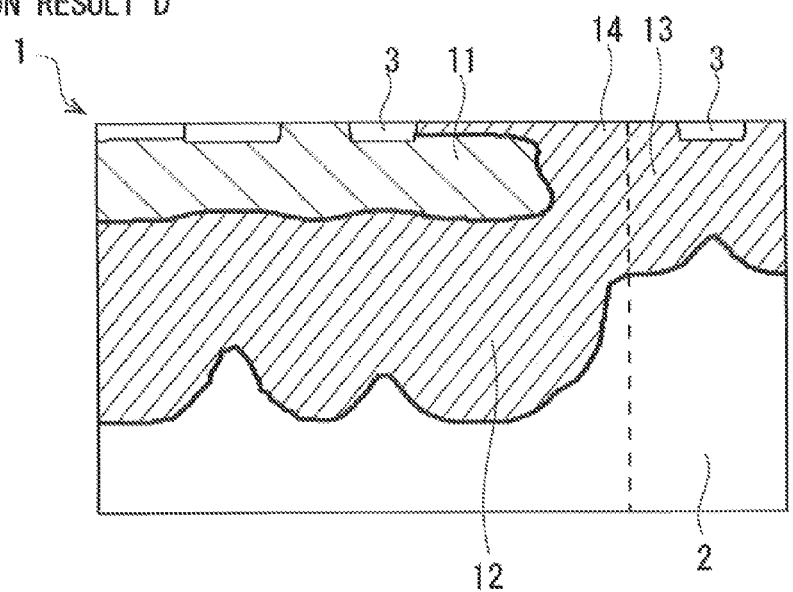
FIG. 23D is a drawing illustrating the results of TCAD simulation.

TCAD (Technology Computer Aided Design) simulations were performed on semiconductor devices 1 manufactured using conditions indicated in FIG. 22 to measure the depth of the HVNW 13 and the resistance between the DNW 12 and the HVNW 13. In addition, TCAD (Technology Computer Aided Design) simulations were performed on semiconductor devices 101 manufactured using the conditions indicated in FIG. 22 to measure the depth of the HVNW 107 and the resistance between the DNW 106 and the HVNW 107. FIGS. 23A and 23B are drawings indicating the results of the TCAD simulations and illustrate cross sections of the semiconductor device 101. FIGS. 23C and 23D are drawings indicating the results of the TCAD simulations and illustrate cross sections of the semiconductor devices 1.

Verification conditions A and B in FIG. 22 represent ion implantation conditions at the time of forming the HVPW 105, DNW 106 and HVNW 107 of each semiconductor devices 101. A P-type impurity used when the HVPW 105 is formed is boron (B), and an N-type impurity used when the DNW 106 and the HVNW 107 are formed is phosphorus (P). In the semiconductor device 101, the HVNW 107 is formed within a semiconductor substrate 102 with the element-isolating insulating film 103 formed on the upper portion of the connecting part between the HVPW 105 and the HVNW 107.

Verification conditions C and D in FIG. 22 represent ion implantation conditions at the time of forming the HVPW 11, DNW 12, HVNW 13 and impurity layer 14 of each semiconductor device 1. A P-type impurity used when the HVPW 11 is formed is boron (B), and an N-type impurity used when the DNW 12 and the HVNW 13 are formed is phosphorus (P). The impurity layer 14 is formed using phosphorus (P) which is the N-type impurity. In the semiconductor device 1, the HVNW 13 is formed within a semiconductor substrate 2 with an element-isolating insulating film 3 not formed on the upper portion of the connecting part between the HVPW 11 and the HVNW 13.

A verification result A in FIG. 23A represents a cross section of the semiconductor device 101 manufactured using the verification conditions A indicated in FIG. 22. A verification result B in FIG. 23B represents a cross section of the semiconductor device 101 manufactured using the verification conditions B indicated in FIG. 22. A verification result C in FIG. 23C represents a cross section of the semiconductor device 1 manufactured using the verification conditions C indicated in FIG. 22. A verification result D in FIG. 23D represents a cross section of the semiconductor device 1 manufactured using the verification conditions D indicated in FIG. 22.

Figure 24:
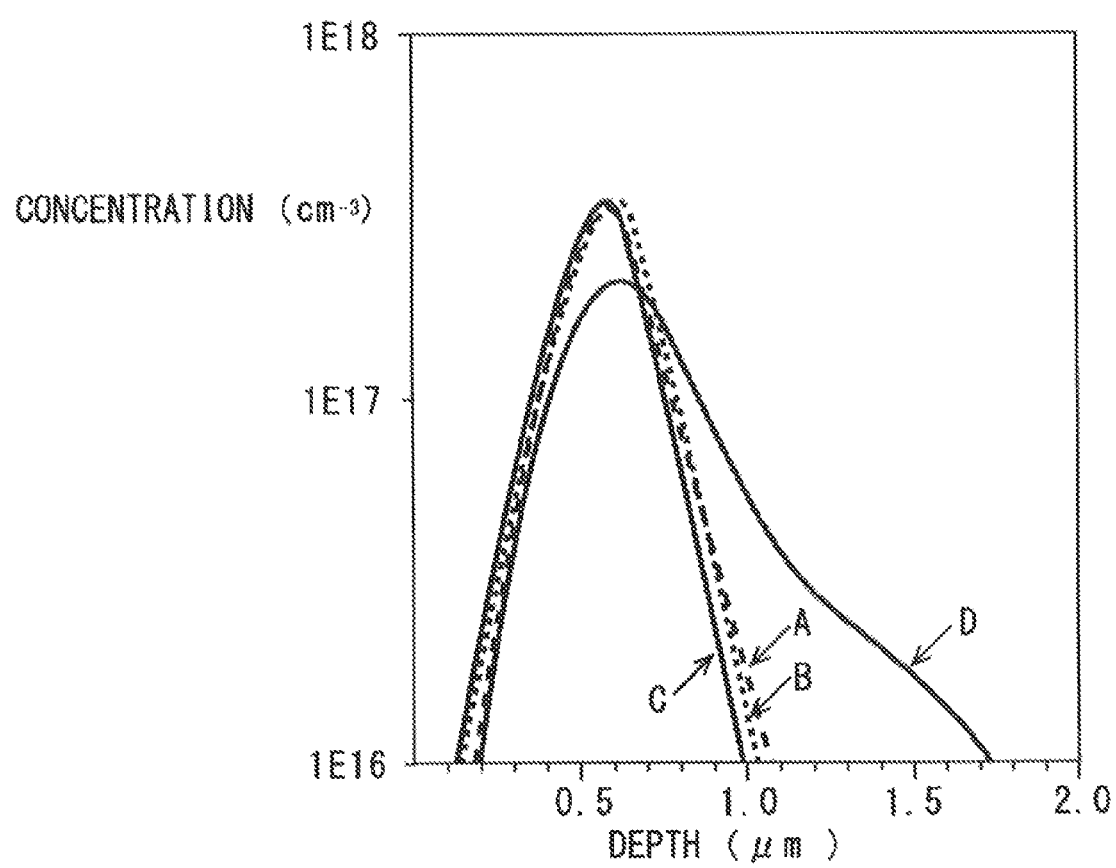
FIG. 24 is a drawing illustrating the results of TCAD simulation.
Figure 25:
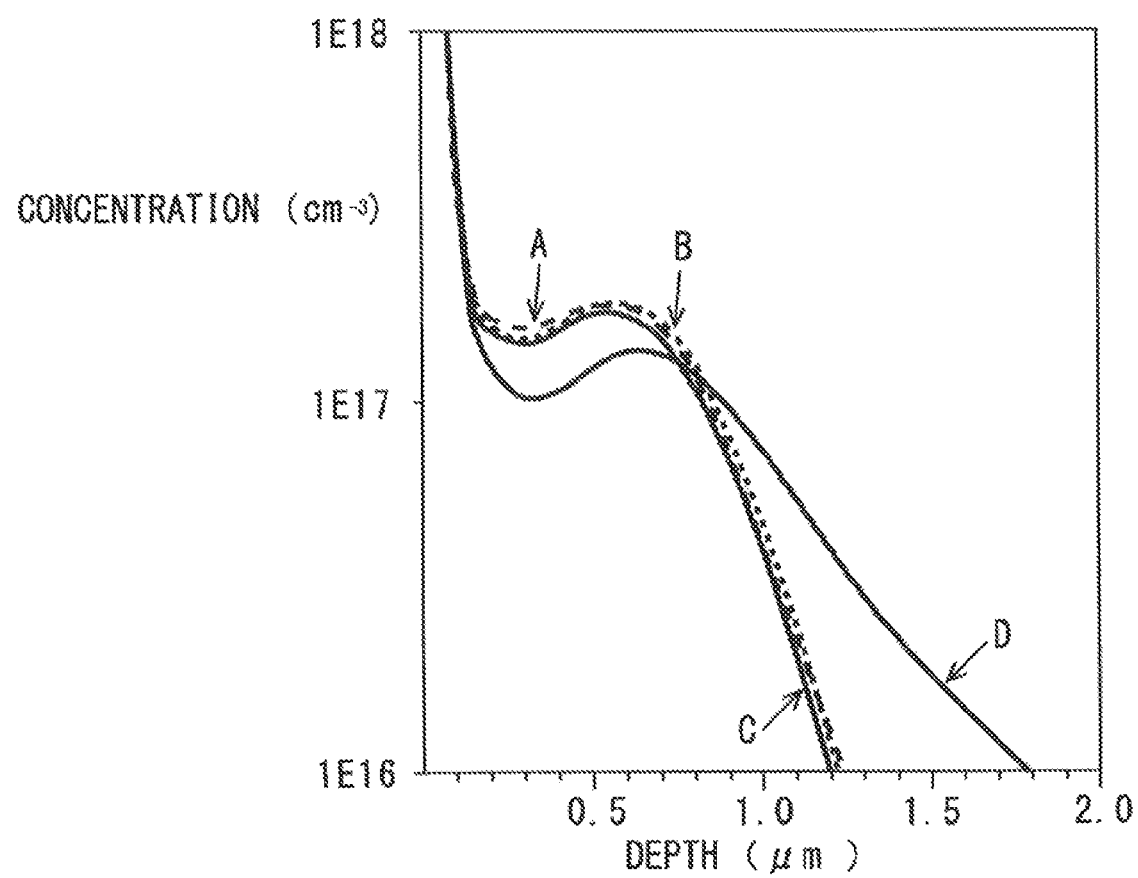
FIG. 25 is a drawing illustrating the results of TCAD simulation.

FIGS. 24 and 25 are drawings representing the results of TCAD simulations. In these figures, impurity concentrations are plotted with respect to the depths of the semiconductor substrates 2 and 102 from the front surfaces thereof at places indicated by dotted lines in FIGS. 23A to 23D. FIG. 24 indicates impurity concentrations immediately after impurities are ion-implanted. FIG. 25 indicates impurity concentrations after the semiconductor devices 1 and 101 are manufactured. Dotted lines A in FIGS. 24 and 25 correspond to the verification result A of FIG. 23A, whereas dotted lines B in FIGS. 24 and 25 correspond to the verification result B of FIG. 23B. Solid lines C in FIGS. 24 and 25 correspond to the verification result C of FIG. 23C, whereas solid lines D in FIGS. 24 and 25 correspond to the verification result D of FIG. 23D. As illustrated in FIGS. 24 and 25, the impurities are implanted up to a position deepest from the front surface of the semiconductor substrate 2 if the HVNW 13 is formed using the verification conditions D indicated in FIG. 22.

The HVNW 13 is formed up to a deep position by ion-implanting the impurities at a tilt angle of 0° under the condition of the element-isolating insulating film 3 not being formed on the upper portion of the connecting part between the HVPW 11 and the HVNW 13. From this result, it is understood that channeling can take place if the impurities ion-implanted at a tilt angle of 0° under the condition of the element-isolating insulating film 3 not being formed on the upper portion of the connecting part between the HVPW 11 and the HVNW 13. A tilt angle of 0° is one example, however, at which channeling can take place. Channeling can also be caused to take place by ion-implanting the impurities at tilt angles other than 0° under the condition of the element-isolating insulating film 3 not being formed on the upper portion of the connecting part between the HVPW 11 and the HVNW 13.

Figure 26:
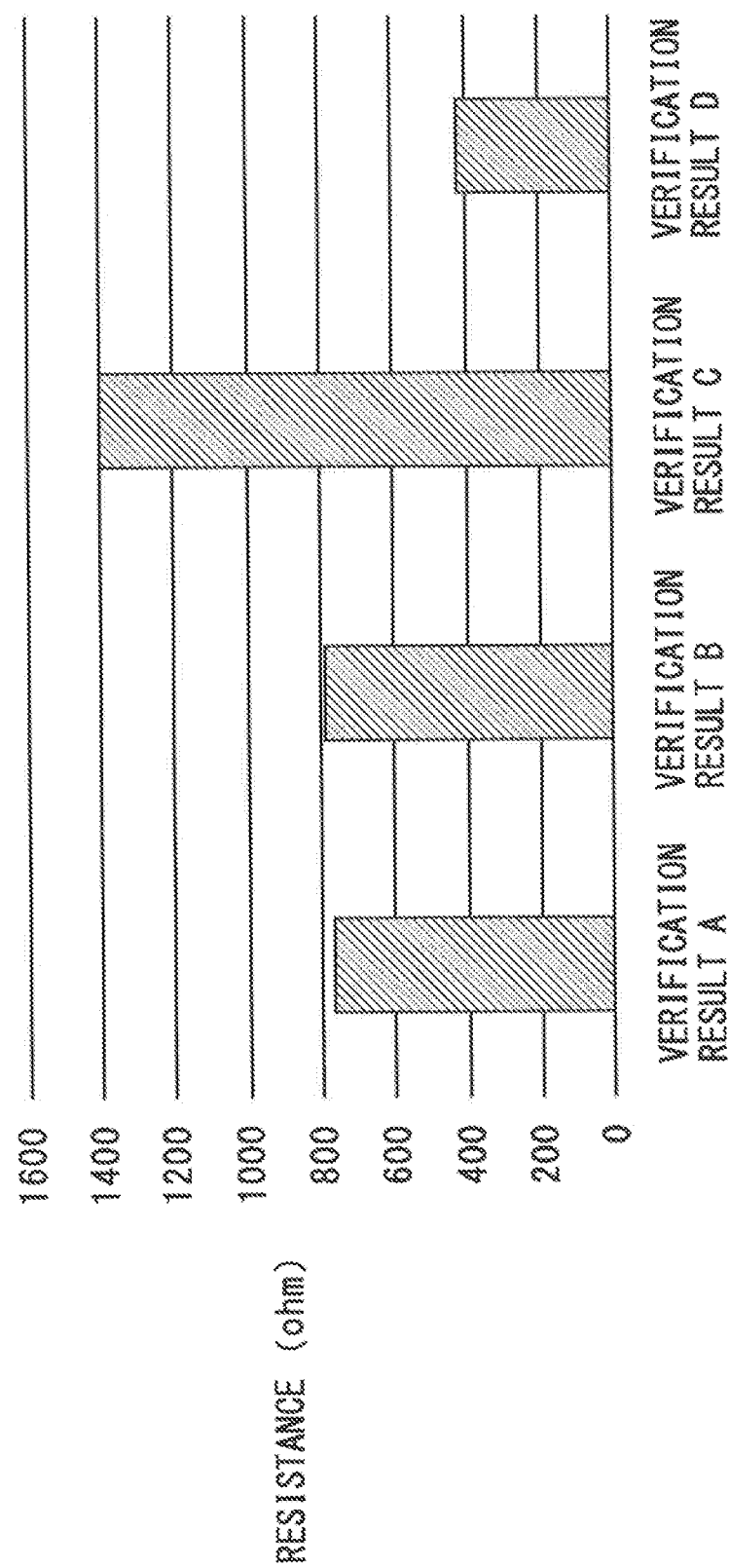
FIG. 26 is a drawing illustrating the results of TCAD simulation.

FIG. 26 is a drawing representing the results of TCAD simulations. The verification result A of FIG. 26 represents a value of resistance between the DNW 106 and the HVNW 107 for the semiconductor device 101 manufactured using the verification conditions A of FIG. 22. The verification result B of FIG. 26 represents a value of resistance between the DNW 106 and the HVNW 107 for the semiconductor device 101 manufactured using the verification conditions B of FIG. 22. The verification result C of FIG. 26 represents a value of resistance between the DNW 12 and the HVNW 13 for the semiconductor device 1 manufactured using the verification conditions C of FIG. 22. The verification result D of FIG. 26 represents a value of resistance between the DNW 12 and the HVNW 13 for the semiconductor device 1 manufactured using the verification conditions D of FIG. 22.

As illustrated in FIG. 26, the value of resistance between the DNW 12 and the HVNW 13 has lowered due to an increase in the area of the connecting part between the DNW 12 and the HVNW 13 in the semiconductor device 1 manufactured using the verification conditions D of FIG. 22. That is, the value of resistance between the DNW 12 and the HVNW 13 of the semiconductor device 1 manufactured using the verification conditions D of FIG. 22 has been reduced by approximately 45% from the value of resistance between the DNW 106 and the HVNW 107 of the semiconductor device 101 manufactured using the verification conditions A and B of FIG. 22.

According to the embodiment, it is possible to reduce the resistance between the second conductivity type well formed underneath the first conductivity type well within the substrate and the second conductivity type well formed horizontally to the first conductivity type well.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
   a substrate;
   a first well of a first conductivity type formed within the substrate;
   a second well of a second conductivity type formed underneath the first well within the substrate;
   a third well of the second conductivity type formed horizontally to the first well within the substrate, and that includes a first region and a second region;
   an insulating film formed on the first region; and
   a silicide block layer formed above the first well and the third well,
   wherein the first region is located horizontally to the second region;
   a bottom of the second region is located deeper than a bottom of the first region;
   the second region is connected to the first well; and
   the insulating film covers over an upper portion of the first region and is not formed on the second region.

2. The semiconductor device according to claim 1, wherein an upper surface of the substrate continuous to an upper surface of the insulating film is positioned on the second region.

3. The semiconductor device according to claim 1, comprising a fourth well of the first conductivity type formed adjacently to the first region within the substrate.

4. The semiconductor device according to claim 1, comprising an impurity layer formed on an upper portion of a connecting part between the first well and the third well,
   wherein the silicide block layer is located on the impurity layer.

5. A method for manufacturing a semiconductor device comprising:
   forming an insulating film on a substrate;
   forming a first well of a first conductivity type within the substrate;
   forming a second well of a second conductivity type underneath the first well within the substrate;
   forming a third well of the second conductivity type and that includes a first region and a second region, and that is located horizontally to the first well within the substrate; and
   forming a silicide block layer above the first well and the third well,
   wherein the first region is located horizontally to the second region;
   a bottom of the second region is located deeper than a bottom of the first region;
   the second region is connected to the first well; and
   the insulating film covers over an upper portion of the first region and is not formed on the second region.

6. The method for manufacturing a semiconductor device according to claim 5, wherein an upper surface of the substrate continuous to an upper surface of the insulating film is positioned on the second region.

7. The method for manufacturing a semiconductor device according to claim 5, comprising forming a fourth well of the first conductivity type within the substrate,
   wherein the fourth well is formed adjacently to the first region within the substrate.

8. The method for manufacturing a semiconductor device according to claim 5, wherein the forming the third well is carried out by implanting impurities at a tilt angle at which channeling takes place.

9. The method for manufacturing a semiconductor device according to claim 5, comprising forming an impurity layer on an upper portion of a connecting part between the first well and the third well,
   wherein the silicide block layer is located on the impurity layer.

10. The semiconductor device according to claim 1, wherein a horizontal width of the bottom of the second region is smaller than a horizontal width of the third well.

11. The method for manufacturing a semiconductor device according to claim 5, wherein a horizontal width of the bottom of the second region is smaller than a horizontal width of the third well.

12. The semiconductor device according to claim 1, wherein the silicide block layer includes an insulating layer.

13. The semiconductor device according to claim 12, wherein the insulating layer includes a silicon oxide film.

14. The semiconductor device according to claim 1, wherein the silicide block layer covers up the impurity layer in plan view.

15. The semiconductor device according to claim 1, comprising gate electrodes formed on the first well and the third well; and
   sidewall insulating films formed on side surfaces of the gate electrodes,
   wherein the sidewall insulating films are formed of the same material as the silicide block layer.

16. The method for manufacturing a semiconductor device according to claim 5, wherein the silicide block layer includes an insulating layer.

17. The method for manufacturing a semiconductor device according to claim 16, wherein the insulating layer includes a silicon oxide film.

18. The method for manufacturing a semiconductor device according to claim 5, wherein the silicide block layer covers up the impurity layer in plan view.

19. The method for manufacturing a semiconductor device according to claim 5, comprising forming gate electrodes on the first well and the third well; and
   forming sidewall insulating films on side surfaces of the gate electrodes,
   wherein the sidewall insulating films are formed of the same material as the silicide block layer.

* * * * *